United States Patent
Maekawa et al.

(10) Patent No.: US 7,226,819 B2
(45) Date of Patent: Jun. 5, 2007

(54) METHODS FOR FORMING WIRING AND MANUFACTURING THIN FILM TRANSISTOR AND DROPLET DISCHARGING METHOD

(75) Inventors: Shinji Maekawa, Kanagawa (JP); Koji Muranaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 77 days.

(21) Appl. No.: 10/970,299

(22) Filed: Oct. 21, 2004

(65) Prior Publication Data

US 2005/0112906 A1    May 26, 2005

(30) Foreign Application Priority Data

Oct. 28, 2003   (JP)   ............... 2003-368030

(51) Int. Cl.
  *H01L 21/84*   (2006.01)
  *H01L 21/00*   (2006.01)
(52) U.S. Cl. ............... 438/149; 257/E21.412
(58) Field of Classification Search ........ 257/E21.412; 438/149
  See application file for complete search history.

(56) References Cited

U.S. PATENT DOCUMENTS

| | | | |
|---|---|---|---|
| 5,304,407 A | 4/1994 | Hayashi et al. | 427/569 |
| 6,521,489 B2 * | 2/2003 | Duthaler et al. | 438/149 |
| 6,613,399 B2 * | 9/2003 | Miyamoto et al. | 427/558 |
| 2003/0080436 A1 | 5/2003 | Ishikawa | 257/776 |
| 2003/0083203 A1 | 5/2003 | Hashimoto et al. | 505/100 |
| 2003/0143339 A1 * | 7/2003 | Kobayashi | 427/558 |
| 2004/0174426 A1 * | 9/2004 | Nomura et al. | 347/238 |
| 2007/0019032 A1 | 1/2007 | Maekawa et al. | |

FOREIGN PATENT DOCUMENTS

| | | |
|---|---|---|
| JP | 11-029873 | 2/1999 |
| JP | 11-207959 | 8/1999 |
| JP | 2003-109794 | 4/2003 |
| JP | 2003/133691 | 5/2003 |
| JP | 2003/273097 | 9/2003 |
| WO | WO 2005/041286 A1 | 5/2005 |

* cited by examiner

*Primary Examiner*—Asok Kumar Sarkar
(74) *Attorney, Agent, or Firm*—Cook, Alex, McFarron, Manzo, Cummings & Mehler, Ltd.

(57) ABSTRACT

It is required that a line width of a wiring is prevented from being wider to be miniaturized when the wiring or the like is formed by a dropping method typified by an ink-jetting method. The invention provides a method for narrowing (miniaturizing) a line width according to a method different from a conventional method. One feature of the invention is that a plasma treatment is performed before forming a wiring or the like by a dropping method typified by an ink-jetting method. As the result of the plasma treatment, a surface for forming a conductive film is modified to be liquid-repellent. Consequently, a wiring or the like formed by a dropping method can be miniaturized.

10 Claims, 20 Drawing Sheets

METHODS FOR FORMING WIRING AND MANUFACTURING THIN FILM TRANSISTOR AND DROPLET DISCHARGING METHOD

BACKGROUND OF THE INVENTION

1. Field of the Invention

The present invention relates to a method for forming a wiring and a method for manufacturing a thin film transistor by dropping a composition into which a material of an object to be formed is mixed. Specifically, the invention relates to a method for forming a wiring and a method for manufacturing a thin film transistor by a droplet discharging method (an ink-jetting method), and further, the droplet discharging method.

2. Description of the Related Art

A droplet discharging method typified by a piezo method or a thermal jet method, or a continuous type droplet discharging method attracts attention. These droplet discharging methods have been used for printing words and drawing images, but they start to be applied to a semiconductor area for forming a minute pattern or the like these days.

A method of forming a film pattern is proposed by Reference 1: the method makes it possible to improve a method of forming a film pattern by an ink-jetting method, make a film thicker, and make a line thinner. Further, problems such as disconnection or short-circuit are not caused in the case of using a conductive film (Reference 1: Japanese Patent Laid Open No. 2003-133691).

According to Reference 1, a substrate is treated in advance so that a contact angle with a droplet is 60 degree, and a droplet is discharged over a whole area for forming a wiring at a larger interval than a diameter of the droplet attached on the substrate, in a first discharging step. A droplet is discharged at a position in the whole area for forming a wiring in a second discharging step, which is different from the position discharged in the first discharging step, at the same interval. In a third discharging step, a droplet is discharged over the whole area for forming a wiring at a smaller interval than the interval in the first discharging step.

Further, plasma exposure in a normal pressure or in vacuum is cited as a surface treatment for controlling a contact angle. Gases used in the plasma treatment can be selected in consideration of a material of a substrate surface on which a conductive wiring is to be formed, and treatment gases such as methane tetrafluoride, perfluorohexane or perfluorodecane can be used, for example, according to Reference 1.

SUMMARY OF THE INVENTION

It is required that a line width of a wiring is prevented from being wider to be miniaturized when the wiring or the like is formed by a method typified by an ink-jetting method described above. Therefore, an object of the present invention is to provide a method for narrowing (miniaturizing) a line width according to a method different from the method described in Reference 1.

Moreover, another object of the invention is to provide a method for forming an element other than a wiring, e.g. a semiconductor film, an insulating film, a mask, or the like by a method typified by an ink-jetting method, and provide a method for narrowing (miniaturizing) a line width thereof.

In view of the objects, one feature of the invention is that a region to be liquid-repellent (a liquid-repellent region) is formed on a surface where a pattern is formed (a surface for forming an element) before forming a desired pattern. In other words, a liquid-repellent treatment is performed on a surface for forming an element before forming a wiring or the like. After that, a pattern for a wiring or the like is formed by a method of dropping (a dropping method), a composition mixed with a conductive material for a wiring or the like (including a composition in which a conductor is dissolved or dispersed in a solvent). There is a droplet discharging method (an ink-jetting method) as the method of dropping a composition mixed with a conductive material.

A piezo method can be employed as an ink-jetting method. A piezo method is also used in inkjet printers since it is superior in a droplet controllability and has higher degree of freedom in selecting an ink. There are given a MLP (Multi Layer Piezo) type and an MLChip (Multi Layer Ceramic Hyper Integrated Piezo Segments) type as the piezo method. In addition, an ink-jetting method using a so-called thermal method may be employed depending on a material of a solution, which pushes out a solution by generating bubbles by heating a heat-generator.

There is a method of performing a plasma treatment on a surface for forming an element as a method of a liquid-repellent treatment. The plasma treatment is performed under conditions: air, oxygen or nitrogen is used as a treatment gas, the pressure is several tens of Torr to 1000 Torr (133000 Pa), preferably, 100(13300 Pa) to 1000 Torr (133000 Pa), further preferably, 700 Torr (93100 Pa) to 800 Torr (106400 Pa). Namely, pulse voltage is applied in a state of atmospheric pressure or pressure in the neighborhood of atmospheric pressure. At the time, plasma density is $1\times10^{10}$ to $1\times10^{14}$ $m^{-3}$ to be in a condition of so-called glow discharge or corona discharge.

When a fluorine-based gas is employed as a treatment gas like Reference 1, it is difficult to perform surface modification on a surface of a semiconductor film. This is because a semiconductor film having silicon is removed by using a fluorine-based gas. When a fluorine-based gas is employed, it is also difficult to perform surface modification on a surface of an organic material such as acrylic. This is because the surface of an organic material is damaged or removed by a fluorine-based gas.

On the contrary, a plasma treatment is performed using air, oxygen or nitrogen, according to the invention. Therefore, it is possible to perform surface modification on a semiconductor film or an organic material, regardless of materials of a surface for forming an element, which is preferable. Cost is low and an exhaust gas treatment is simple since a treatment gas is air, oxygen or nitrogen.

In particular, a plasma treatment using oxygen as a treatment gas can be employed for removing a mask for patterning a semiconductor film or the like, which is preferable.

In a plasma processor used for a plasma treatment according to the invention, a dielectric is formed between an electrode and an object (an object to be treated) that is exposed to a plasma treatment, and the dielectric is exposed to generated plasma. As the dielectric, Teflon (a registered trademark) can be employed. For example, an electrode provided with a dielectric in one surface thereof to be exposed to plasma is prepared and plasma is generated between an object and the electrode so as to expose the dielectric to plasma. Thus, the whole electrode surface is not necessarily covered with the dielectric.

In the invention, concrete pulse voltage is resonated to be applied, like each damped oscillation wave, as a damped oscillation waveform periodic wave in which the damped oscillation wave is generated repeatedly and intermittently. For example, a pair of plus pulse and minus pulse is supplied to a primary side of a high-voltage transformer with repetition frequency, and the damped oscillation waveform periodic wave which is resonated as each damped oscillation wave is outputted from a secondary side of the high-voltage transformer to be applied to a pair of electrodes. The voltage rise time of each resonated damped oscillation wave is preferably 5 µs or less at the time. The repetition period of the damped oscillation wave is preferably 10 to 100 kHz. The pulse is preferably 100 to 10000 pps (10000 times per second).

As a result of performing a plasma treatment described above, a surface to be provided with a conductive film (a surface for forming an element) is modified. For example, when Teflon is provided on one surface of an electrode, $CF_2$ is formed on a surface for forming a conductive film, and a liquid-repellent property with low wettability with water, alcohol, oil or other liquids is shown.

After that, a composition including a conductive material is dropped to form a wiring. Accordingly, a line width becomes small, thereby achieving miniaturization.

In other words, one feature of the invention is that a liquid-repellent region is formed on a surface for forming a conductive film. Thus, at least, a liquid-repellent treatment is performed, and then, a conductive film is formed to form a minute wiring, according to the invention. For example, after a film including fluorine such as Teflon is formed, a minute wiring may be formed by dropping a composition including a conductive material.

According to the invention, a wiring is formed by discharging a composition including a conductive material (a material forming a wiring) mixed in a solvent. Such a step of discharging a composition is preferably performed under low pressure. The solvent of the composition is evaporated until the composition lands on an object to be treated since it is discharged, and thus, steps of drying and baking the composition can be both omitted. It is preferable to perform the step under low pressure, since an oxide film or the like is not formed on the surface of the conductive material. The step of dropping a composition may be performed in a nitrogen atmosphere or an organic gas atmosphere.

At this time, the composition is discharged to be a dot shape (droplet) or a pillar shape by a series of dots; however, they are collectively referred to as a dot (droplet). Discharging a dot (droplet) means that a dot-like droplet or a pillar-like droplet is discharged. In other words, since a plurality of dots are discharged continuously, a pillar-like (dot) droplet is discharged in some cases without being recognized as a dot.

Specifically, when a wiring is formed by a method of dropping a dot having a conductive material, a photolithography step such as light-exposure or development of a mask for patterning the wiring, and an etching step for patterning the wiring can be omitted.

Gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), an alloy thereof, a dispersive nanoparticle thereof, or a silver halide particle can be used as the conductive material. Specifically, silver or copper which is low resistant is preferably used. However, in the case of using copper, it is necessary that an insulating film containing nitrogen is formed as a barrier film to prevent copper from spreading into a semiconductor film or the like. In addition, ITO (indium tin oxide), IZO (indium zinc oxide) in which zinc oxide (ZnO) of 2% to 20% is mixed into indium oxide, ITSO in which silicon oxide ($SiO_2$) of 2% to 20% is mixed into indium oxide, organic indium, organotin, titanium nitride (TiN), or the like can be also used as a transparent conductive material.

One feature of the invention is that a minute wiring is formed by a dropping method typified by an ink-jetting method. A structure of a thin film transistor for forming a wiring, or the like is not limited. In other words, a thin film transistor may have either a crystalline semiconductor film or an amorphous semiconductor film and may be either a bottom gate type in which a gate electrode is formed under a semiconductor film or a top gate type in which a gate electrode is formed over a semiconductor film.

When a gate electrode, a source electrode, a drain electrode and each wiring connected to the electrodes of a thin film transistor are formed by a dropping method typified by an ink-jetting method, a plasma treatment is performed, thereby achieving miniaturization. Namely, when a conductive film of a thin film transistor is formed by a dropping method typified by an ink-jetting method, a plasma treatment can be performed on a surface for forming a conductive film.

A conductive film is described above, but according to the invention, a plasma treatment may be performed on a surface forming a mask or the like, for example. In other words, one feature of the invention is that a plasma treatment is performed on a surface for forming an object to be miniaturized.

According to the invention, surface modification can be performed by a plasma treatment using a treatment gas of air, oxygen, or nitrogen without materials dependence, in this manner. Consequently, surface modification can be performed on every material. Thus, even wirings formed on a substrate or an insulating film can be miniaturized. In addition, miniaturization of a mask or the like to be formed on an organic material can be achieved, since material dependencies are not required to be considered.

One feature of the present invention is that a plasma treatment is performed on a surface for forming an element in one step of forming a desired pattern of a mask, a wiring or the like by a dropping method typified by an ink-jetting method. In other words, an advantageous effect of miniaturizing a wiring, a mask, or the like formed by a dropping method typified by an ink-jetting method after performing a plasma treatment in the step described above, can be obtained according to the invention. Therefore, in a step of manufacturing a thin film transistor according to the invention, a wiring is not necessarily formed by a dropping method typified by an ink-jetting method after a plasma treatment, and a plasma treatment may be performed when a minute pattern is required to be formed by a dropping method typified by an ink-jetting method.

Production-lines of glass substrates from the fifth generation on, by a dropping method typified by an ink-jetting method, of which mother glass substrate is one meter or more in one side, e.g. equal to or more than 1000 mm×1300 mm, 1000 mm×1500 mm, 1800 mm×2200 mm, has been considered. At this time, a large number of panels can be formed from a mother glass, and thus, it is expected that the cost of a panel be lowered. It is possible to build a production line which can maintain profitability by employing a dropping method typified by an ink-jetting method. This is because a photo process can be simplified by forming a wiring or the like by a dropping method typified by an ink-jetting method. Consequently, a photo mask becomes unnecessary, and reduction of costs such as a facility investment cost can be achieved. Further, manufacturing time can be shortened since a photolithography step becomes unnecessary. Efficiency in the use of materials improves, and a cost and an amount of waste liquid can be reduced by a dropping method typified by an ink-jetting method. It is preferable that a dropping method typified by an ink-jetting method is applied to a large-size substrate, in this way.

These and other objects, features and advantages of the invention become more apparent upon reading of the following detailed description along with the accompanying drawings.

DETAILED DESCRIPTION OF THE INVENTION

[Embodiment Modes]

Figure 1A:
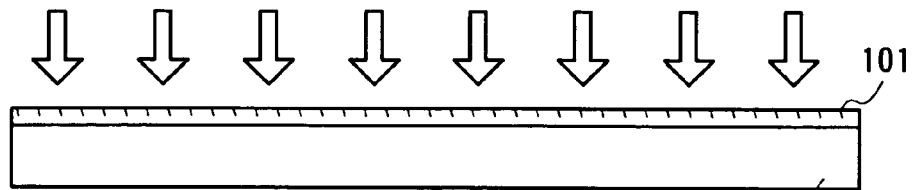
FIGS. 1A to 1E are each a cross-sectional view of a thin film transistor according to one aspect of the invention.

Embodiment modes of the present invention are hereinafter described with reference to accompanying drawings. The invention can be implemented with various modes. It is to be understood that various changes and modifications will be apparent to those skilled in the art, unless such changes and modifications depart from the scope of the invention hereinafter defined. Therefore, the present invention is not limited to Embodiment Modes. Note that the same reference numerals are each given to the same portion or a portion having a similar function throughout all figures for explaining embodiment modes, and description thereof is not repeated to be omitted.

An ink-jetting method is used as a dropping method in Embodiment Modes hereinafter. Note that a plasma treatment is used for a liquid-repellent treatment, unless otherwise noted.

A TFT has three terminals, a gate, a source and a drain, but it is difficult to precisely distinguish a source terminal (source electrode) from a drain terminal (drain electrode) in a TFT structure. Therefore, one of a source electrode and a drain electrode is referred to as a first electrode and the other is referred to as a second electrode, in describing a connection between elements.

[Embodiment Mode 1]

An example of a method of manufacturing a thin film transistor is described in Embodiment Mode 1.

As shown in FIG. 1A, a base film 101 is formed on a substrate 100 having an insulating surface. For example, a glass substrate such as a barium borosilicate glass or an alumino borosilicate glass, a quartz substrate, a stainless substrate or the like can be used for the substrate 100. In addition, a substrate made of plastic typified by polyethylene-terephthalate (PET), polyethylene naphthalate (PEN), polyeter sulfone (PES) and synthetic resin having flexibility such as acryl tends to have worse heat-resistance than other types of substrates. However, such substrates can be used as long as they can resist a treatment temperature in a manufacturing step. Specifically, a substrate made of flexible synthetic resin is easy to use when a thin film transistor including an amorphous semiconductor film, for which a heat treatment for crystallization of a semiconductor film is not required, is formed.

The base film 101 is formed in order to prevent an alkaline metal such as Na or an alkaline earth metal contained in the substrate 100 from spreading in a semiconductor film and exerting an adverse influence on semiconductor element characteristics. The base film can be therefore formed by using an insulating film such as silicon oxide, silicon nitride, silicon oxynitride, titanium oxide, or titanium nitride, which is capable of suppressing the spread of an alkaline metal or an alkaline earth metal into the semiconductor film. In addition, the base film can be formed by using a conductive film such as titanium. At this time, the conductive film is oxidized by a heat treatment or the like in a manufacturing step in some cases. Specifically, a material of the base film may employ the one having high adhesiveness with a gate electrode material. For example, a base film made of titanium oxide ($TiO_x$) is preferably formed when Ag is used for the gate electrode. Note that the base film 101 may have a single layer structure or a laminated structure. In this embodiment mode, the base film employs a laminated structure of a first base film and a second base film. A silicon oxynitride film is formed as the first base film by a plasma CVD method with $SiH_4$, $N_2O$, $NH_3$, or $H_2$ used as a material gas, pressure of 0.3 Torr (39.9 Pa), RF power of 50 W, an RF frequency of 60 MHz, a substrate temperature of 400° C. to be from 10 nm to 200 nm (preferably, from 50 nm to 200 nm) in thickness. A silicon oxynitride film is formed as the second base film by a plasma CVD method with $SiH_4$ or $N_2O$ used as a material gas, pressure of 0.3 Torr (39.9 Pa), RF power of 150 W, an RF frequency of 60 MHz, a substrate temperature of 400° C. to be from 50 nm to 200 nm (preferably, from 150 nm to 200 nm) in thickness.

It is effective to provide a base film in order to prevent impurity diffusion in the case of using a substrate that contains a certain amount of an alkaline metal or an alkaline earth metal, such as a glass substrate, a stainless substrate or a plastic substrate. However, a base film is not necessarily provided when using a quartz substrate or the like, for which impurity diffusion does not cause a problem. In other words, a base film is not necessarily provided, as long as it is possible to prevent impurities from diffusing into a semiconductor film. For example, when a semiconductor film is formed over a gate electrode with a gate insulating film therebetween, a base film is not needed since the gate insulating film can have a function of preventing impurities from diffusing into the semiconductor film.

After that, a plasma treatment is performed on a surface for forming a gate electrode. In this embodiment mode, since the surface for forming a gate electrode is a base film, a plasma treatment is performed on the base film. The plasma treatment is desirably performed without being in contact with a surface for forming a gate electrode.

The plasma treatment is performed by using air, oxygen, or nitrogen as a treatment gas under the pressure of several tens of Torr to 800 Torr (106400 Pa), preferably, 700 Torr (93100 Pa) to 800 Torr (atmospheric pressure or pressure in the neighborhood of atmospheric pressure). In addition, an RF source or an AC source can be used as a power supply of the plasma treatment. For example, plasma is generated by varying power by applying voltage with an AC source under conditions of alternate voltage of 100 V, frequency of 13.56 MHz and the like. Pulse is applied with an interval of voltage width of 2 to 4 μsec to discharge stable plasma. As a result of performing this plasma treatment, surface modification is made so that the surface becomes liquid-repellent, that is, low in wettability, to liquid such as alcohol or oil.

Figure 1B:
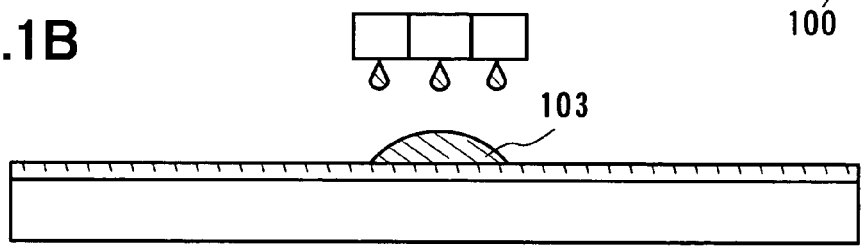

By using an ink-jetting method, a conductive film to serve as a gate electrode 103 is formed by dropping a dot including a conductive material mixed into a solvent, as shown in FIG. 1B. In this embodiment mode, a dot in which a conductive material of silver (Ag) is dispersed in a solvent of tetradecane is dropped. Tetradecane is a solvent having a liquid-repellent property to a surface that is exposed to a plasma treatment. Therefore, as the result of the plasma treatment, the gate electrode formed by an ink-jetting method can be miniaturized.

After that, when the solvent of the dot is required to remove, a heat treatment for baking or drying is conducted. Specifically, a heat treatment is conducted preferably in an atmosphere containing oxygen at a predetermined temperature, e.g. 200° C. to 300° C. At the time, heating temperature is set in order not to produce unevenness on a surface of the gate electrode. Like this embodiment mode, in the case of using a dot having silver (Ag), silver (Ag) that does not include an organic material can be obtained, since an organic material such as thermosetting resin of an adhesive agent, etc. included in a solvent, or the like is decomposed, when a heat treatment is performed in an atmosphere containing oxygen or nitrogen. Consequently, planarity of a gate electrode surface can be increased and specific resistance value can be lowered.

The gate electrode can be made of an element selected from tantalum, tungsten, titanium, molybdenum, aluminum, and copper, or an alloy material or a compound material mainly containing the element, in addition to silver (Ag). The conductive film can be formed by sputtering or plasma CVD instead of an ink-jetting method. A semiconductor film typified by a polycrystalline silicon film doped with an impurity element such as phosphorus or an AgPdCu alloy can be used as the conductive film formed by sputtering or plasma CVD.

Figure 1C:
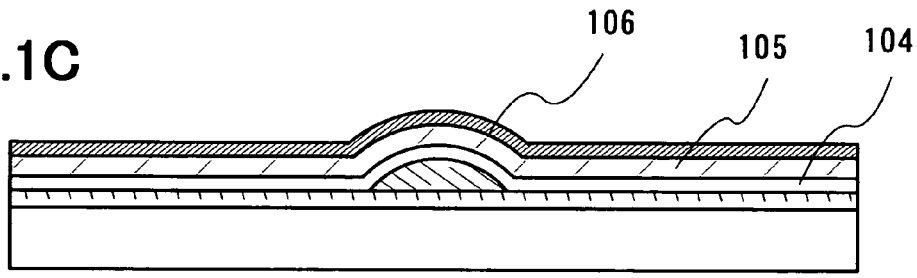

As shown in FIG. 1C, an insulating film which serves as a gate insulating film 104 is formed to cover the gate electrode. The insulating film can have a laminated structure or a single layer structure. An insulator such as silicon oxide, silicon nitride or silicon oxynitride can be formed as the insulating film by plasma CVD. Note that a dot including a material of an insulating film may be discharged by an ink-jetting method to form the gate insulating film. Like this embodiment mode, when the gate electrode is made of silver (Ag), it is preferable that a silicon nitride film is used for the insulating film covering the gate electrode. This is because there is a risk that a surface of the gate electrode becomes uneven since silver oxide is formed by a reaction with silver (Ag), in the case of using an insulating film including oxygen.

A semiconductor film 105 is formed over the gate insulating film. The semiconductor film can be formed by a plasma CVD method, a sputtering method, an ink-jetting method or the like. The semiconductor film is 25 to 200 nm thick (preferably, 30 to 60 nm). Silicon germanium as well as silicon can be used for the material of the semiconductor film. In the case of using silicon germanium, the concentration of germanium is preferably about 0.01 to 4.5 atomic %. In addition, the semiconductor film may be an amorphous semiconductor, a semi-amorphous semiconductor in which crystal grains are dispersed in an amorphous semiconductor or a micro crystal semiconductor in which crystal grains of 0.5 nm to 20 nm can be seen in an amorphous semiconductor Note that a state of a micro crystal in which crystal grains of 0.5 nm to 20 nm can be seen is referred to as a micro crystal (μc).

Semi-amorphous silicon using silicon (also referred to as SAS) as a material of a semi-amorphous semiconductor can be obtained by grow discharge decomposition of a silicide gas. As a typical silicide gas, $SiH_4$ is cited, besides, $Si_2H_6$, $SiH_2Cl_2$, $SiHCl_3$, $SiCl_4$, $SiF_4$ and the like can be used. SAS can be formed easily by a silicide gas diluted with hydrogen, or hydrogen and one or more rare gas elements selected from helium, argon, krypton, and neon. The silicide gas is preferably diluted so that the dilution rate is in the range of 10 times to 1000 times. SAS can be also formed with $Si_2H_6$ and $GeF_4$ by a method of diluting them with a helium gas. The reactive formation of a film by grow discharge decomposition is preferably conducted under low pressure, and the pressure may be about 0.1 Pa to 133 Pa. The power for grow discharge may be 1 MHz to 120 MHz, preferably, a high frequency power of 13 MHz to 60 MHz. The substrate heating temperature is preferably 300° C. or less, and more preferably, substrate heating temperature of 100° C. to 250° C. is recommended.

In this embodiment mode, an amorphous semiconductor film (also, referred to as an amorphous silicon film or amorphous silicon) containing silicon as the main component is formed by using plasma CVD.

A semiconductor film having one conductivity type is formed. The semiconductor film having one conductivity type can be formed by using a plasma CVD method, a sputtering method, an ink-jetting method or the like. When the semiconductor film having one conductivity type is formed, contact resistance of a semiconductor film and an electrode becomes low, which is preferable. The semiconductor film having one conductivity type may be formed as necessary. In this embodiment mode, a semiconductor film having N type conductivity 106 is formed by plasma CVD. When the semiconductor film and the semiconductor film having N type conductivity are formed by using plasma CVD, the semiconductor film 105, the semiconductor film having N type conductivity 106, and a gate insulating film are preferably formed sequentially. The sequential formation is possible by varying a material gas supply without being exposed to the atmosphere.

Figure 1D:
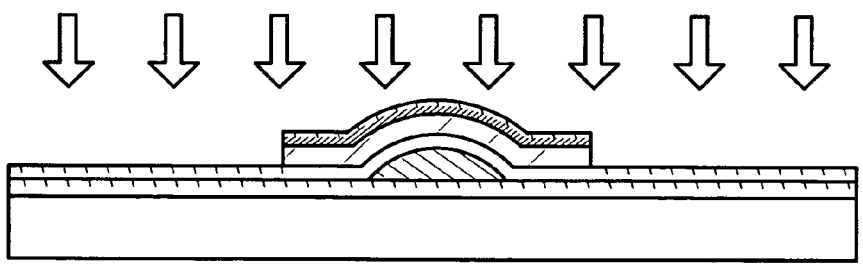

As shown in FIG. 1D, the semiconductor film 105 and the semiconductor film having N type conductivity 106 are patterned into a desired shape. Although not shown, a mask may be formed at a desired portion and the films may be etched by using the mask. The mask is preferably formed by an ink-jetting method, since efficiency in the use of a material can be improved and a cost and an amount of waste liquid can be reduced. Alternatively, the mask may be formed by a photolithography method. When the mask is formed by an ink-jetting method, further, a photolithography step can be simplified. In other words, a step of forming a photomask, a light-exposure step and the like are not required, and therefore, a facility investment cost can be reduced and manufacturing time can be shortened. When a mask is formed by an ink-jetting method, a plasma treatment may be performed on a surface for forming the mask. Consequently, a mask formed by an ink-jetting method can be miniaturized.

As the mask material, an inorganic material (such as silicon oxide, silicon nitride, silicon oxynitride), a photosensitive or non-photosensitive organic material (such as polyimide, acryl, polyamide, polyimidamide, polyvinyl alcohol, benzocyclobutene or resist) can be used. For example, when a mask is formed from polyimide by an ink-jetting method, polyimide may be discharged at a desired portion by an ink-jetting method and then may be heat-treated at 150° C. to 300° C. to be baked. Thereafter, the semiconductor film 105 and the semiconductor film having N type conductivity 106 are etched by using the mask. A plasma treatment is performed to remove the mask after etching. Note that the mask formed by an ink-jetting method may serve as an insulting film without being removed.

A plasma treatment is conducted on a surface for forming a source electrode and a drain electrode as shown in FIG. 1A. In this embodiment mode, a plasma treatment is performed on the semiconductor film having N type conductivity, which is a surface for forming a source electrode and a drain electrode, and the gate insulating film. The plasma treatment may be performed without being in contact with the surface for forming the source electrode and the drain electrode. As a result of performing this plasma treatment, surface modification is made so that the surface becomes liquid-repellent, that is, low in wettability, to liquid such as alcohol or oil.

Figure 1E:
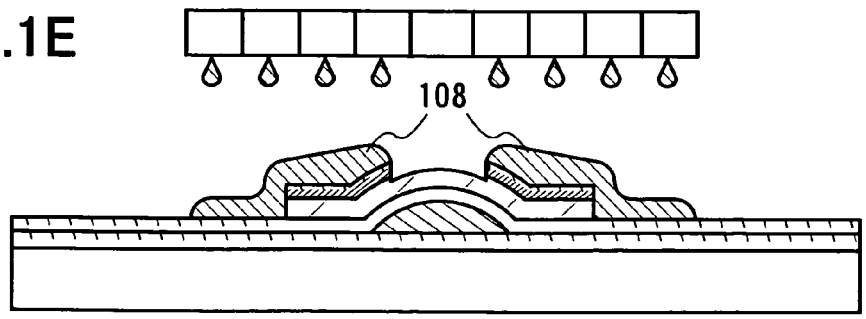

As shown in FIG. 1E, a conductive film functioning as a source electrode and a drain electrode 108 is formed. The conductive film may have a single layer structure or a laminated structure. As the conductive film, a film made of an element selected from gold, silver, copper, aluminum, titanium, molybdenum, tungsten or silicon or an alloy film using the element, can be used. Further, the conductive film can be formed by an ink-jetting method, a CVD method or a sputtering method. In this embodiment mode, the conductive film is formed by using a dot including silver (Ag) by an ink-jetting method. Specifically, it is performed similarly to the case of forming the gate electrode shown in FIG. 1B. As the result of the plasma treatment, the source electrode and the drain electrode formed by an ink-jetting method can be miniaturized.

After that, a heat treatment for baking or drying is performed, when the solvent of the dot is required to remove.

After that, the semiconductor film having N type conductivity 106 is etched by using the source electrode and the drain electrode as a mask. This is because the semiconductor film having N type conductivity prevents the source electrode and the drain electrode from being short-circuited. At the time, the semiconductor film 105 can be also etched to some extent in some cases.

As described above, a thin film transistor in which up to the source electrode and the drain electrode have been provided is formed. The thin film transistor in this embodiment mode is a so-called bottom gate type thin film transistor, in which a gate electrode is formed under a semiconductor film. More in detail, it is a so-called channel etch type, in which a semiconductor film is etched to some extent. A substrate where such plural thin film transistors are formed is referred to as a TFT substrate.

As for the thin film transistor shown in this embodiment mode, a plasma treatment is performed before forming a conductive film by an ink-jetting method. The plasma treatment is performed before forming a gate electrode, a source electrode and a drain electrode by an ink-jetting method, but a plasma treatment may be performed before at least one ink-jetting step. Thus, a plasma treatment may be performed before an ink-jetting step which is not shown in this embodiment mode.

As described above, a thin film transistor having miniaturized gate, source and drain electrodes can be obtained by a plasma treatment before an ink-jetting step.

Efficiency in the use of materials improves, and a cost and an amount of waste liquid can be reduced when a wiring, a mask or the like is formed by an ink-jetting method. In particular, steps in the case of forming a mask by an ink-jetting method are more simplified than the case of a photolithography step. Consequently, reduction of costs such as a facility investment cost can be achieved, and manufacturing time can be shortened.

[Embodiment Mode 2]

A method for manufacturing a thin film transistor which has a structure different from that in Embodiment Mode 1 is described in Embodiment Mode 2. The structure different from that in Embodiment Mode 1 is that a protective film is formed over a semiconductor film. Therefore, other manufacturing methods may be referred to Embodiment Mode 1 and detailed description thereof is omitted.

Figure 2A:
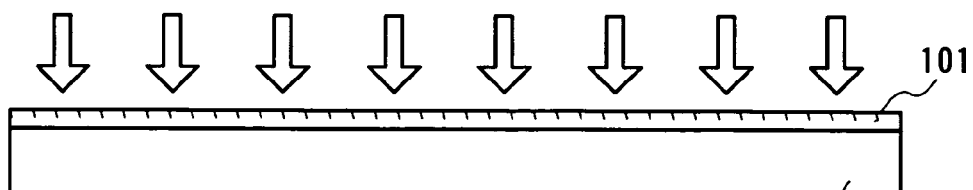
FIGS. 2A to 2E are each a cross-sectional view of a thin film transistor according to one aspect of the invention.

As shown in FIG. 2A, a base film 101 is formed on a substrate 100 having an insulating surface. A plasma treatment is performed on the base film 101. As a result of this plasma treatment, surface modification is made so that the surface becomes liquid-repellent, that is, low in wettability, to liquid such as alcohol or oil.

Figure 2B:
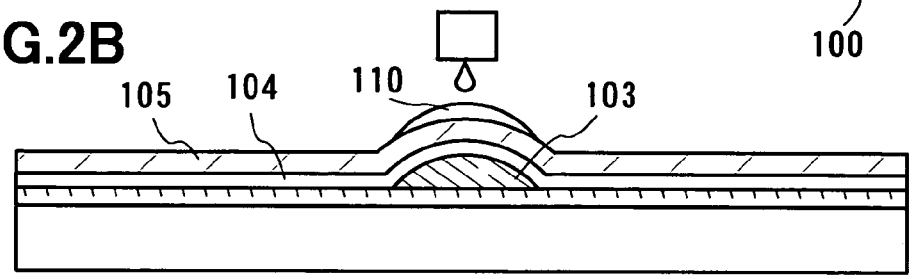

As shown in FIG. 2B, a gate electrode 103 is formed on the base film, a gate insulating film 104 is formed to cover the gate electrode, and a semiconductor film 105 is formed on the gate insulating film. As a result of performing the plasma treatment, the gate electrode formed by an ink-jetting method can be miniaturized. After that, a heat treatment for baking or drying is performed, when the solvent of a dot is required to remove. Then, a protective film is formed on the semiconductor film. An insulating film such as silicon oxide, silicon nitride, or silicon oxynitride is formed as the protective film by an ink-jetting method, a plasma CVD method, a sputtering method or the like. In addition, the semiconductor film, the protective film, and the gate insulating film may be formed sequentially. In the same chamber, they can be sequentially formed by changing supply of a material gas without being exposed to the atmosphere.

In addition, efficiency in the use of materials improves, and a cost and an amount of waste liquid can be reduced when the protective film is formed by an ink-jetting method. And a photolithography step can be simplified when the protective film is formed by an ink-jetting method. Accordingly, a photo mask becomes unnecessary, and reduction of costs such as a facility investment cost can be achieved. Further, manufacturing time can be shortened, since a photolithography step becomes unnecessary. At the time, a plasma treatment may be performed on a surface for forming the protective film. Accordingly, the protective film formed by an ink-jetting method can be miniaturized. A protective film 110 is formed by dropping polyimide, polyvinyl alcohol or the like by an ink-jetting method in this embodiment mode.

When the protective film is required to be patterned into a desired shape, the patterning is conducted by using a mask. At the time, the protective film can be etched in a self-aligned manner by being exposed to light using the gate electrode as a mask from a backside of the substrate. Of course, the mask may be formed by a photolithography method or an ink-jetting method. When the mask is formed by an ink-jetting method, a plasma treatment may be performed on a surface for forming the mask. Accordingly, the mask formed by an ink-jetting method can be miniaturized.

Figure 2C:
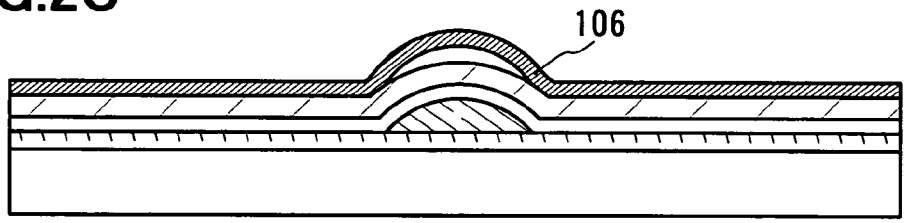

As shown in FIG. 2C, a semiconductor film having one conductivity type is formed. In this embodiment mode, the semiconductor film having N type conductivity 106 is formed by a plasma CVD method.

Figure 2D:
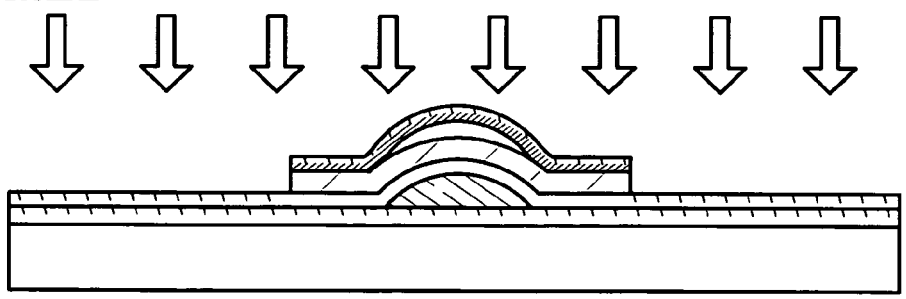

As shown in FIG. 2D, the semiconductor film having N type conductivity and the semiconductor film are patterned into a desired shape. In this case, although not shown, a mask may be formed at a desired portion and etching may be performed by using the mask. The mask is preferably formed by an ink-jetting method, since efficiency in the use of materials can be improved and a cost and an amount of waste liquid can be reduced. However, it may be formed by a photolithography step. In particular, steps in the case of forming a mask by an ink-jetting method can be more simplified than the, case of a photolithography step. Consequently, reduction of costs such as a facility investment cost can be achieved, and manufacturing time can be shortened. In this embodiment mode, polyimide, polyvinyl alcohol or the like is dropped as a mask by an ink-jetting method. At the time, a plasma treatment may be performed on a surface for forming a mask. As a result, the mask formed by an ink-jetting method can be miniaturized.

A plasma treatment is conducted to remove the mask after etching. The mask formed by an ink-jetting method may serve as an insulating film without being removed.

A plasma treatment is performed on a surface for forming a source electrode and a drain electrode as in FIG. 2A. In this embodiment mode, a plasma treatment is performed on a semiconductor film having N type conductivity, which is the surface for forming the source electrode and the drain electrode, and a gate insulating film. The plasma treatment may be performed without being in contact with the surface for forming the source electrode and the drain electrode. As a result of this plasma treatment, surface modification is made so that the surface becomes liquid-repellent, that is, low in wettability, to liquid such as alcohol or oil.

Figure 2E:
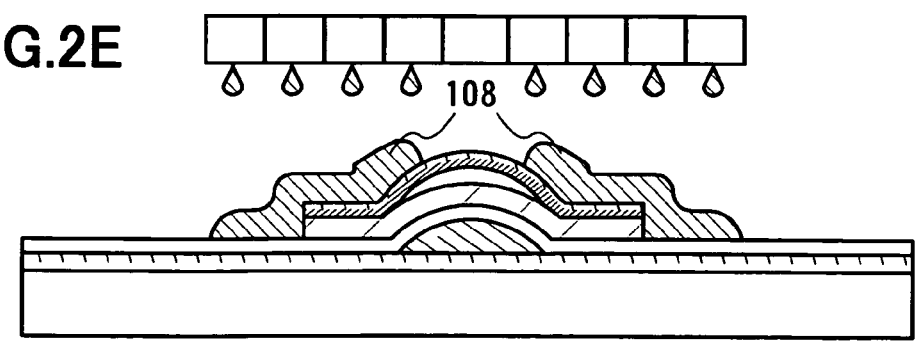

As shown in FIG. 2E, a conductive film functioning as a source electrode and a drain electrode 108 is formed. In this embodiment mode, the conductive film is formed by using a dot including silver (Ag) by an ink-jetting method. As the result of the plasma treatment, the source electrode and the drain electrode formed by an ink-jetting method can be miniaturized. After that, a heat treatment for baking or drying may be performed, when the solvent of the dot is required to remove.

As described above, a thin film transistor in which up to the source electrode and the drain electrode have been provided is formed. The thin film transistor in this embodiment mode is a so-called bottom gate type thin film transistor, in which a gate electrode is formed under a semiconductor film. More in detail, it is a so-called channel protective type, in which a semiconductor film is not etched. A substrate where such plural thin film transistors are formed is referred to as a TFT substrate.

As for the thusly obtained thin film transistor, a plasma treatment is performed before forming a conductive film by an ink-jetting method. The plasma treatment is performed before forming a gate electrode, and a source and drain electrode by an ink-jetting method, but the plasma treatment may be performed before at least one ink-jetting step. Thus, a plasma treatment may be performed before an ink-jetting step that is not shown in this embodiment mode.

As described above, a thin film transistor having miniaturized gate, source and drain electrodes can be obtained by a plasma treatment before an ink-jetting step.

Efficiency in the use of materials improves, and a cost and an amount of waste liquid can be reduced when a wiring, a mask or the like is formed by an ink-jetting method. In particular, steps in the case of forming a mask by an ink-jetting method can be more simplified than the case of a photolithography step. Consequently, reduction of costs such as a facility investment cost can be achieved, and manufacturing time can be shortened.

[Embodiment Mode 3]

A method for manufacturing a thin film transistor, which has a structure different from those in Embodiment Modes 1 and 2, is described in Embodiment Mode 3. The thin film transistor, in which a gate electrode is provided over a semiconductor film, is a so-called top gate type thin film transistor. Therefore, other manufacturing methods may be referred to Embodiment Modes 1 and 2 and detailed description thereof is omitted.

Figure 3A:
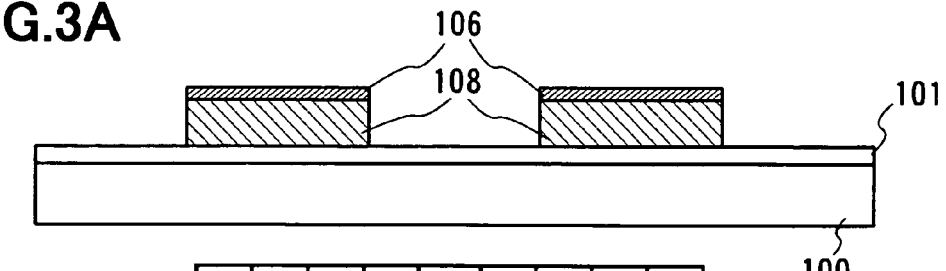
FIGS. 3A to 3E are each a cross-sectional view of a thin film transistor according to one aspect of the invention.

As shown in FIG. 3A, a base film 101 is formed on a substrate 100 having an insulating surface. After that, a conductive film to be a source and drain electrode 108 and a semiconductor film having one conductivity are formed sequentially. In this embodiment mode, a semiconductor film having N type conductivity 106 is used for the semiconductor film having one conductivity. The conductive film to be a source and drain electrode and the semiconductor film having N type conductivity are formed, and then, are patterned into a desired shape by using a mask. Although not shown, the mask can be formed by an ink-jetting method or a photolithography method. Efficiency in the use of materials improves, and a cost and an amount of waste liquid can be reduced when a mask is formed by an ink-jetting method. In particular, steps in the case of forming a mask by an ink-jetting method can be more simplified than the case of a photolithography step. Consequently, reduction of costs such as a facility investment cost can be achieved, and manufacturing time can be shortened. When a mask is formed by an ink-jetting method, a plasma treatment may be performed on a surface for forming the mask. Accordingly, the mask formed by an ink-jetting method can be miniaturized. The mask is formed by dropping polyimide, polyvinyl alcohol or the like by an ink-jetting method in this embodiment mode. Thereafter, the mask is baked by heating as necessary and patterned by dry etching.

A plasma treatment is conducted to remove the mask after patterning. The mask formed by an ink-jetting method may serve as an insulating film without being removed.

Figure 3B:
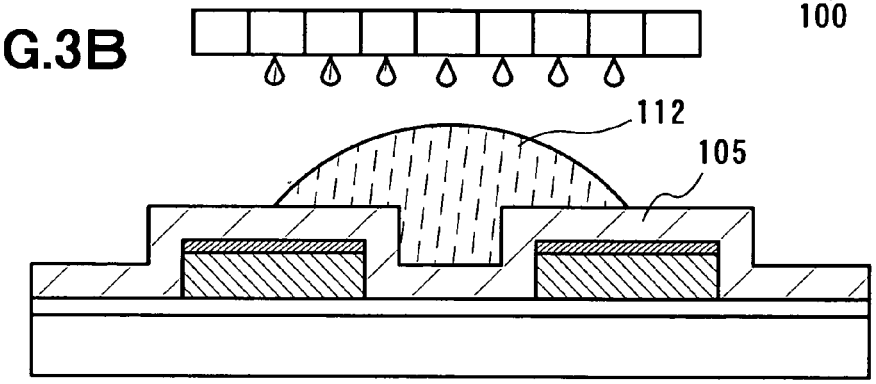

As shown in FIG. 3B, a semiconductor film 105 is formed to cover the semiconductor film having N type conductivity. A mask 112 is formed on the semiconductor film 105. The mask 112 can be formed by an ink-jetting method or a photolithography method. The mask is formed by dropping polyimide, polyvinyl alcohol or the like by an ink-jetting method in this embodiment mode. The mask formed by an ink-jetting method is baked by heating as necessary. Note that a plasma treatment may be performed on the semiconductor film 105 at the time. Consequently, the mask formed by an ink-jetting method can be miniaturized.

After that, the semiconductor film 105 is patterned into a desired shape by using the mask. At the same time, the semiconductor film having N type conductivity can be also patterned. In other words, when the semiconductor film 105 and the semiconductor film having N type conductivity 106 have the same etching rate to one gas, they are patterned simultaneously.

A plasma treatment is performed to remove the mask 112 after patterning. Note that the mask formed by an ink-jetting method may serve as an insulating film without being removed.

Figure 3C:
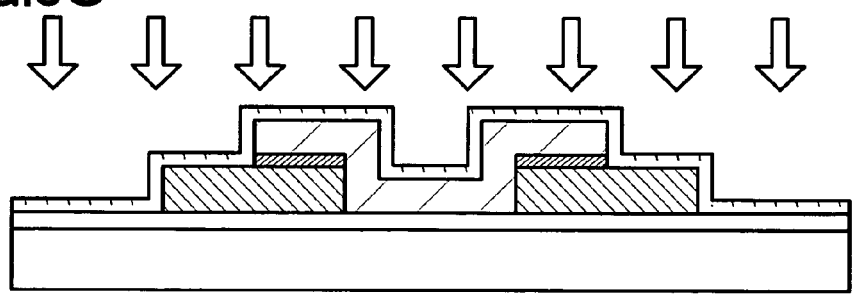

As shown in FIG. 3C, the insulating film which functions as a gate insulating film 104 is formed to cover the semiconductor film 105. The gate insulating film may be formed at least between the semiconductor film and a gate electrode to be formed later. A plasma treatment is performed on the gate insulating film 104. As a result of this plasma treatment, surface modification is made so that the surface becomes liquid-repellent, that is, low in wettability, to liquid such as alcohol or oil.

Figure 3D:
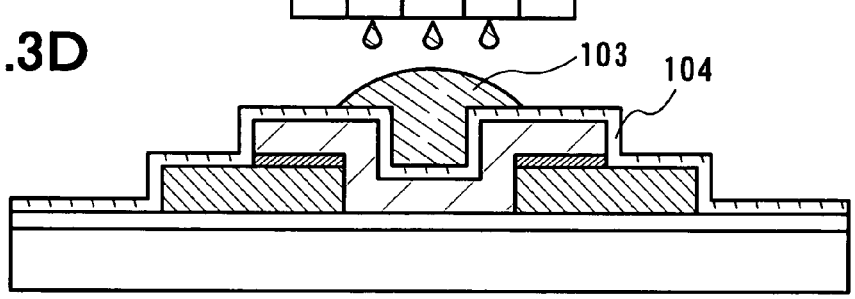

As shown in FIG. 3D, a conductive film functioning as a gate electrode 103 is formed on the semiconductor film with a gate insulating film therebetween. In this embodiment mode, a dot in which a conductive material of Ag is dispersed in a solvent of tetradecane is dropped. As a result of performing the plasma treatment, the gate electrode formed by an ink-jetting method can be miniaturized. After that, a heat treatment for baking or drying is conducted when the solvent of the dot is required to remove.

Thus, a thin film transistor in which up to a gate electrode has been formed and which serves as a semiconductor element is completed. A substrate where such plural thin film transistors are formed is referred to as a TFT substrate.

Figure 3E:
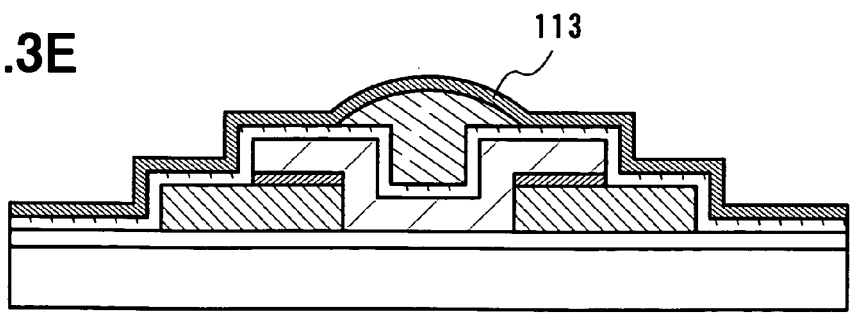

As shown in FIG. 3E, a protective film 113 is formed to at least cover the gate electrode. The protective film can have a laminated structure or a single layer structure. An insulator such as silicon oxide, silicon nitride or silicon oxynitride can be formed as the protective film by plasma CVD. Note that a dot including a material of an insulating film may be discharged by an ink-jetting method to form the protective film. Like this embodiment mode, when the gate electrode is made of silver (Ag), it is preferable that a silicon nitride film is used for the protective film covering the gate electrode. This is because there is a risk that a surface of the gate electrode becomes uneven since silver oxide is formed by a reaction with silver (Ag) when a protective film containing oxygen is used.

The thin film transistor in this embodiment mode, in which a gate electrode is provided over a semiconductor film, is a so-called a top gate type thin film transistor.

As for a thin film transistor formed as in this embodiment, a plasma treatment is conducted before forming a conductive film by an ink-jetting method. In this embodiment mode, a plasma treatment is performed before forming the gate electrode by an ink-jetting method. However, a plasma treatment may be performed before at least one ink-jetting step. Thus, a plasma treatment may be conducted before an ink-jetting step that is not described in this embodiment mode.

As described above, a thin film transistor having a miniaturized gate electrode can be obtained by a plasma treatment before an ink-jetting step.

Efficiency in the used of materials improves, and a cost and an amount of waste liquid can be reduced when a wiring, a mask or the like is formed by an ink-jetting method. In particular, steps in the case of forming a mask by an ink-jetting method can be more simplified than the case of a photolithography step. Consequently, reduction of costs such as a facility investment cost be achieved, and manufacturing time can be shortened.

[Embodiment Mode 4]

A method for manufacturing a thin film transistor, which has a structure different from that of Embodiment Mode 3, is described in Embodiment Mode 4. The structure is different from that of Embodiment Mode 3 in that a source and drain electrode is formed by an ink-jetting method. Thus, other manufacturing methods may be referred to Embodiment Mode 3 and detailed description thereof is omitted.

Figure 4A:
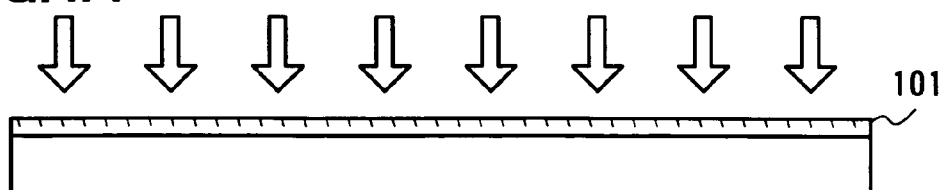
FIGS. 4A to 4E are each a cross-sectional of a thin film transistor according to one aspect of the invention.

As shown in FIG. 4A, a base film 101 is formed on a substrate 100 having an insulating surface. A plasma treatment is performed on the base film 101. As a result of this plasma treatment, surface modification is made so that the surface becomes liquid-repellent, that is, low in wettability, to liquid such as alcohol or oil.

Figure 4B:
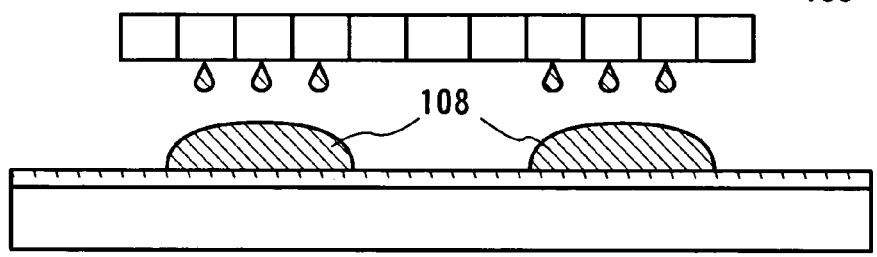

As shown in FIG. 4B, a source and drain electrode is formed by an ink-jetting method. In this embodiment mode, a dot in which a conductive material of Ag is dispersed in a solvent of tetradecane is dropped. As a result of the plasma treatment, the source and drain electrode formed by an ink-jetting method can be miniaturized. After that, a heat treatment for baking or drying is conducted when the solvent of the dot is required to remove.

Figure 4C:
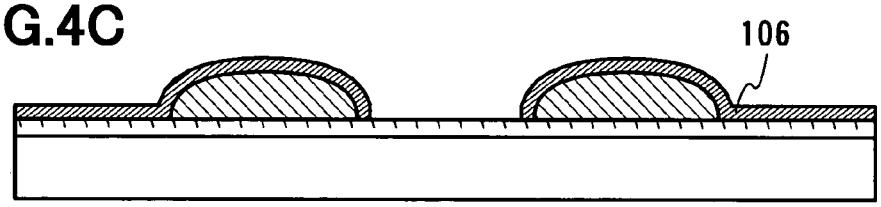

As shown in FIG. 4C, a semiconductor film having one conductivity type is formed to cover the source and drain electrode. A semiconductor film having N type conductivity 106 is used as the semiconductor film having one conductivity type in this embodiment mode. The semiconductor film having N type conductivity covering the source and drain electrode is etched for preventing a short-circuit. For example, the semiconductor film having N type conductivity between the source electrode and the drain electrode is etched by a dry-etching method by using a mask.

Figure 4D:
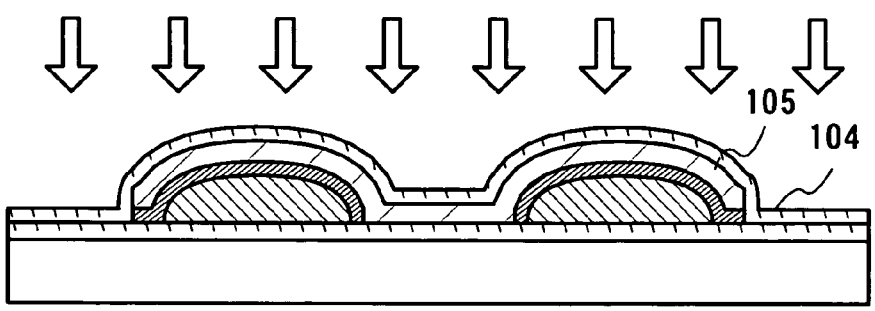

As shown in FIG. 4D, a semiconductor film 105 is formed to cover the semiconductor film having N type conductivity. Then, the semiconductor film 105 is patterned by using a mask. At the same time, the semiconductor film having N type conductivity may be also patterned in some cases. In other words, when the semiconductor film 105 and the semiconductor film having N type conductivity 106 have the same etching rate to one gas, they are patterned simultaneously. The mask can be formed by an ink-jetting method or a photolithography method. Although not shown, the mask is formed by dropping polyimide, polyvinyl alcohol or the like by an ink-jetting method in this embodiment mode. The mask may be baked by heating as necessary and patterned by dry etching. Note that a plasma treatment may be performed on the semiconductor film 105 at the time. Consequently, the mask formed by an ink-jetting method can be miniaturized.

A plasma treatment is performed to remove the mask after patterning. Note that the mask formed by an ink-jetting method may serve as an insulating film without being removed.

Thereafter, an insulating film functioning as a gate insulating film 104 is formed to cover the semiconductor film. A plasma treatment is performed on the gate insulating film 104. As a result of this plasma treatment, surface modification is made so that the surface becomes liquid-repellent, that is, low in wettability, to liquid such as alcohol or oil.

Figure 4E:
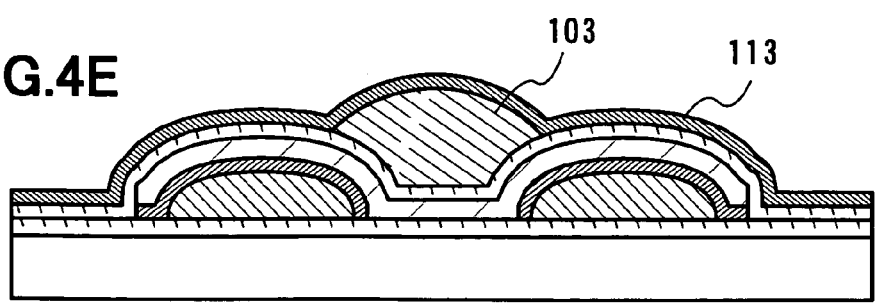

As shown in FIG. 4E, a conductive film functioning as a gate electrode 103 is formed on a semiconductor film with a gate insulating film therebetween. In this embodiment mode, a dot in which a conductor of silver (Ag) is dispersed in a solvent of tetradecane is dropped. As the result of the plasma treatment, the gate electrode formed by an ink-jetting method can be miniaturized. After that, a heat treatment for baking or drying is conducted when the solvent of the dot is required to remove.

Thus, a thin film transistor in which up to a gate electrode has been formed and which serve as a semiconductor element is completed. A substrate where such plural thin film transistors are formed is referred to as a TFT substrate.

Then, a protective film 113 is preferably formed to cover at least the gate electrode. The protective film can have a laminated structure or a single layer structure. As the protective film, an insulator such as silicon oxide, silicon nitride or silicon oxynitride can be formed by a plasma CVD method. Note that a protective film may be formed by discharging a dot including a material of an insulating film by an ink-jetting method. Like this embodiment mode, a silicon nitride film is preferably used for the protective film covering the gate electrode, when silver (Ag) is used for the gate electrode. This is because there is a risk that a surface of the gate electrode becomes uneven since silver oxide is formed due to a reaction with silver (Ag), when the protective film containing oxygen is used.

The thin film transistor in this embodiment mode, in which a gate electrode is provided over a semiconductor film, is a so-called a top gate type thin film transistor.

As for the thusly obtained thin film transistor, a plasma treatment is conducted before forming a conductive film by an ink-jetting method. The plasma treatment is performed before forming a gate electrode, and a source electrode and drain electrode by an ink-jetting method, but the plasma treatment may be performed before at least one ink-jetting step. Thus, a plasma treatment may be performed before an ink-jetting step that is not shown in this embodiment mode.

As described above, a thin film transistor having miniaturized source, drain and gate electrodes can be obtained by a plasma treatment before an ink-jetting step.

Efficiency in the use of materials improves, and a cost and an amount of waste liquid can be reduced when a wiring, a mask or the like is formed by an ink-jetting method. In particular, steps in the case of forming a mask by an ink-jetting method are more simplified than the case of a photolithography step. Consequently, reduction of costs such as a facility investment cost can be achieved, and manufacturing time can be shortened.

[Embodiment Mode 5]

An example of forming a thin film transistor using a crystalline semiconductor film is described in Embodiment Mode 5.

Figure 18A:
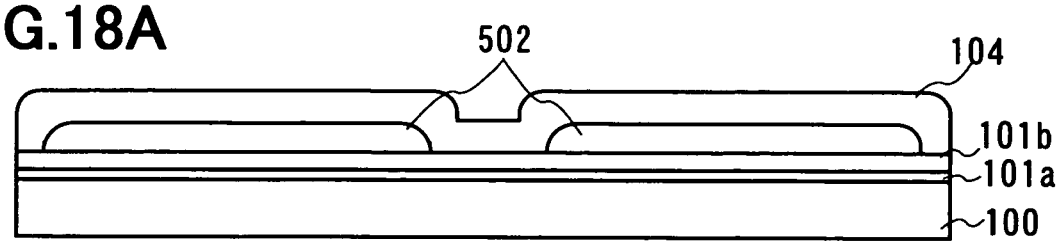
FIGS. 18A to 18D are each a cross-sectional view of a thin film transistor according to one aspect of the invention.

As shown in FIG. 18A, a base film 101 is formed on a substrate 100 having an insulating surface. The base film 101 may have a laminated structure. In this embodiment mode, the base film 101 has a laminated structure in which a first base film 101a and a second base film 101b are laminated in order. A silicon oxynitride film is formed as the first base film 101a by a plasma CVD method with $SiH_4$, $N_2O$, $NH_3$, or $N_2$ as a material gas, at a pressure of 0.3 Torr (39.9 Pa), an RF power of 50 W, an RF frequency of 60 MHz, a substrate temperature of 400° C. to be from 10 nm to 200 nm (preferably, from 50 nm to 200 nm) in thickness. A silicon oxynitride film is formed as the second base film 101b by a plasma CVD method with $SiH_4$ or $N_2O$ as a material gas, at a pressure of 0.3 Torr (39.9 Pa), an RF power of 150 W, an RF frequency of 60 MHz, a substrate temperature of 400° C. to be from 50 nm to 200 nm (preferably, from 150 nm to 200 nm) in thickness.

An amorphous semiconductor film is formed on the base film 101. The amorphous semiconductor film is 25 to 100 nm thick (preferably, 30 to 60 nm). Silicon germanium as well as silicon can be used for the material of the amorphous semiconductor film. In the case of using silicon germanium, the concentration of germanium is preferably about 0.01 to 4.5 atomic %. In addition, the semiconductor film mainly containing silicon of 66 nm (also, referred to as an amorphous silicon film or amorphous silicon) is used in this embodiment mode.

The amorphous semiconductor film is crystallized to form a crystalline semiconductor film. A method of adding a metal element promoting crystallization of an amorphous semiconductor film and heating it can be employed as the crystallization method. One or more elements selected from Ni, Fe, Co, Pd, Pt, Cu, Au, Ag, In and Sn can be used as the metal element. It is preferable to use the metal element, since low temperature crystallization is possible. However, a step of removing the metal element, a so-called gettering step, is required.

The amorphous semiconductor film may be irradiated with laser light. Continuous wave laser (CW laser) or a pulsed laser (pulse oscillation type) can be used. One laser or more lasers selected from an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser can be used as the laser.

For example, an Ni solution (including a water solution or an acetic acid medium) is applied over the amorphous semiconductor film by an application method such as spin-coating or dipping or an ink-jetting method. At the time, it is preferable to form an oxide film to be 1 to 5 nm thick by UV light irradiation in an oxygen atmosphere, a thermal oxidation method, a treatment using ozone water including hydroxyl radical or hydrogen peroxide or the like, in order that wettability is improved in the surface of the amorphous semiconductor film to make the solution applied over the entire surface of the amorphous semiconductor film. In addition, an Ni ion may be injected into an amorphous semiconductor film by an ion implantation method, a heat treatment may be performed in an atmosphere of steam containing Ni, or sputtering may be conducted with Ar plasma using an Ni material as a target. In this embodiment mode, a water solution including Ni acetate of 10 ppm is applied by a spin coating method.

After that, the amorphous semiconductor film may be heat-treated for 2 to 20 hours at temperatures from 500 to 550° C. and crystallized to form a crystalline semiconductor film. At this time, it is preferable that a heating temperature is changed gradually. Dehydrogenation, which can reduce film unevenness in crystallization, can be conducted, since hydrogen and the like come out of the amorphous semiconductor film by the initial heat treatment at low temperature. A magnetic field may be applied to crystallize with its magnetic energy, or a high power microwave may be used. In this embodiment mode, after a heat treatment is performed for one hour at 500° C., a heat treatment is performed for four hours at 550° C. in a vertical furnace.

An island like semiconductor film 502 is formed by patterning the crystalline semiconductor film.

An insulating film serving as a gate insulating film 104 is formed to cover the island like semiconductor film 502. The insulating film described above can be used for the gate insulating film. $TiO_2$ is used for the gate insulating film in this embodiment mode.

Figure 18B:
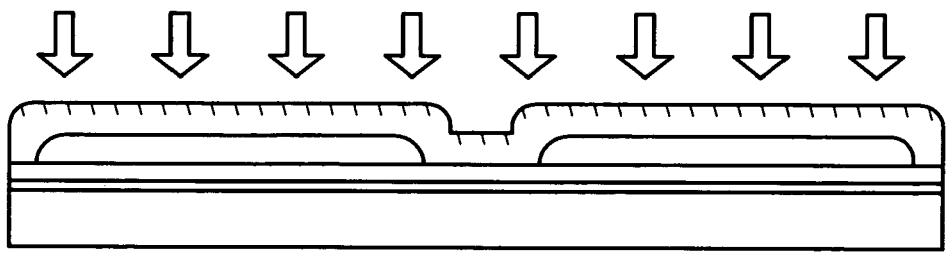

As shown in FIG. 18B, a plasma treatment is performed on a surface for forming the gate electrode. In this embodiment mode, a plasma treatment is performed on the gate insulating film that is the surface for forming the gate electrode. The plasma treatment may be performed without being in contact with the surface for forming the gate electrode. As a result of this plasma treatment, a surface modification is made so that the surface becomes liquid-repellent, that is, low in wettability, to liquid such as alcohol or oil. In other words, a liquid-repellent region is formed by the plasma treatment.

Figure 18C:
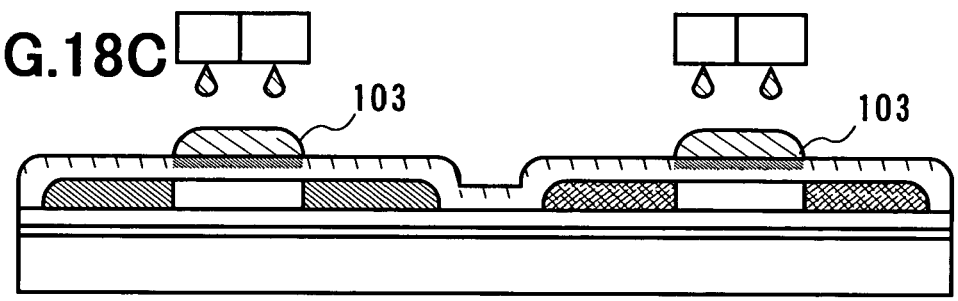

As shown in FIG. 18C, a conductive film functioning as the gate electrode 103 is formed by dropping a dot mixed with a conductive material in a solvent by an ink-jetting method. In this embodiment mode, a dot in which a conductor of silver (Ag) is dispersed in a solvent of tetradecane is dropped. The gate electrode formed by an ink-jetting method can be miniaturized by dropping a dot to a plasma irradiation region.

After that, a heat treatment for baking or drying is conducted when the solvent of the dot is required to remove. Specifically, the heat treatment may be at a predetermined temperature, e.g. 200° C. to 300° C., preferably, it may be conducted in an atmosphere containing oxygen. At the time, a heating temperature is set so that unevenness on the gate electrode surface is not generated. When a dot including silver (Ag) is employed like this embodiment mode, a heat treatment is conducted in an atmosphere containing oxygen and nitrogen, thereby decomposing an organic material such as thermosetting resin of an adhesive agent or the like included in the solvent to obtain silver (Ag) that does not include the organic material. Consequently, planarity of the gate electrode surface is increased and specific resistance value can be reduced The gate electrode can be made of an element selected from tantalum, tungsten, titanium, molybdenum, aluminum, and copper, or an alloy material or a compound material mainly containing the element, in addition to silver (Ag). The conductive film can be formed by a sputtering method or a plasma CVD method instead of an ink-jetting method. A semiconductor film typified by a polycrystalline silicon film doped with an impurity element such as phosphorus or an AgPdCu alloy can be used as the conductive film formed by sputtering or plasma CVD.

After that, an impurity element is added in a self aligned manner by using the gate electrode 103. For example, phosphorus (P) is added into a semiconductor film that is to be an N-channel thin film transistor and boron (B) is added into a semiconductor film that is to be a P-channel thin film transistor.

As described above, a thin film transistor in which up to an impurity region has been formed, is completed. The thin film transistor in this embodiment mode is a crystalline thin film transistor having a crystalline semiconductor film and is a top gate thin film transistor, in which a gate electrode is formed over a semiconductor film. A substrate where such plural thin film transistors are formed is referred to as a TFT substrate.

Figure 18D:
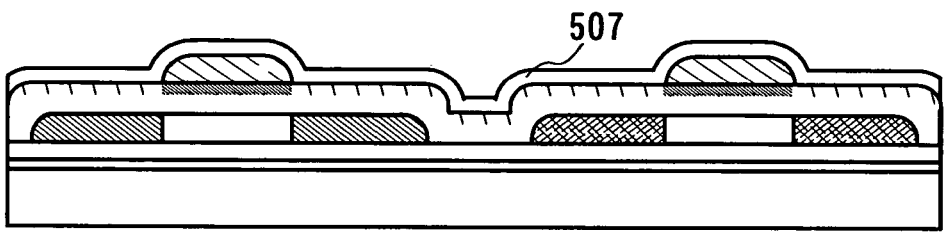

After that, as shown in FIG. 18D, an insulating film 507 containing nitrogen is formed to cover the gate electrode 103. In this embodiment mode, the insulating film 507 can be formed by an ink-jetting method, too. After that, dangling bonds of a semiconductor film can be reduced, by heating after forming the insulating film 507.

As for the thusly obtained thin film transistor, a plasma treatment is conducted before forming a conductive film by an ink-jetting method. The plasma treatment is performed before forming a gate electrode, and a source and drain electrode by an ink-jetting method, but a plasma treatment may be performed before at least one ink-jetting step. Thus, a plasma treatment may be performed before an ink-jetting step that is not shown in this embodiment mode.

As described above, a thin film transistor having miniaturized source, drain and gate electrodes can be obtained by a plasma treatment before an ink-jetting step. Further, a wiring can be formed in a lyophilic region even when a dot is discharged out of alignment to some extent. Thus, a position of a wiring to be formed can be controlled with accuracy.

Efficiency in the use of materials improves, and a cost and an amount of waste liquid can be reduced when a wiring, a mask or the like is formed by an ink-jetting method. In particular, steps in the case of forming a mask by an ink-jetting method can be more simplified than the case of a photolithography step. Consequently, reduction of costs such as a facility investment cost can be achieved, and manufacturing time can be shortened.

[Embodiment Mode 6]

An apparatus for a plasma treatment is described in Embodiment Mode 6.

Figure 15A:
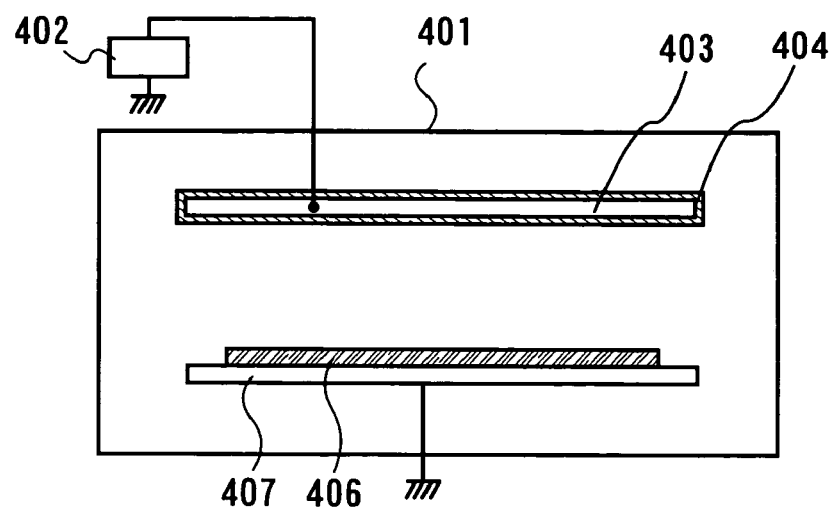
FIGS. 15A and 15B each show a plasma processor according to one aspect of the invention.

As shown in FIG. 15A, an electrode 403, a dielectric 404 that is formed to cover a surface of the electrode, a power supply 402 connected to the electrode, a substrate 406 having a surface (an object surface) to be exposed to a plasma treatment, a stage 407 for fixing a substrate are provided in a treatment chamber 401. Teflon (a registered trademark) is employed as the dielectric in this embodiment mode.

In this embodiment mode, the dielectric is formed to cover the surface of the electrode, but the dielectric may be disposed at least so as to be exposed to plasma generated between an object to be treated and the electrode. For example, the dielectric may be provided between the object and the electrode.

A substrate having a surface to be treated by a plasma treatment is arranged on the stage and pulse voltage is applied from the power supply. Then, plasma is generated between the electrode and the substrate. The density of the plasma is $1\times10^{10}$ to $1\times10^{14} m^{-3}$. The pressure in the treatment chamber is several tens of Toff to 800 Torr (106400 Pa), preferably, 700 Torr (93100 Pa) to 800 Torr (atmospheric pressure or pressure in the neighborhood of atmospheric pressure) and pulse voltage is used to discharge.

Pulse voltage is applied to generate stable plasma in atmospheric pressure or pressure in the neighborhood of atmospheric pressure in this embodiment mode. Air, oxygen or nitrogen is used as a treatment gas in this plasma treatment.

Concretely, voltage to be applied is resonated, like each damped oscillation wave, as a damped oscillation waveform periodic wave in which the damped oscillation wave is generated repeatedly and intermittently. A pair of plus pulse and minus pulse is supplied to a primary side of a high-voltage transformer with repetition frequency, and the damped oscillation waveform periodic wave which is resonated as each damped oscillation wave is outputted from a secondary side of the high-voltage transformer to be applied to a pair of electrodes. The voltage rise time of each resonated damped oscillation wave is preferably 5 µs or less at the time. The repetition period of the damped oscillation wave is preferably 10 to 100 kHz. The pulse is preferably 100 to 10000 pps (10000 times per second).

As the result of the plasma treatment, a surface for forming a conductive film is modified. Specifically, when Teflon is attached to the surface of the electrode, a $CF_2$ bond is formed on the surface for forming a conductive film. A specific state of the $CF_2$ bond before and after the plasma treatment will be shown in Embodiment. As a result, the treated surface shows a liquid-repellent property. After that, when a wiring or the like is formed thereon, a line width becomes narrow, thereby achieving miniaturization of the wiring.

When a plasma treatment is conducted preferably under atmospheric pressure or pressure in the neighborhood of atmospheric pressure in this manner, it can be easily conducted without vacuuming. As a result, manufacturing time of a thin film transistor can be shortened drastically. Needless to say, the plasma treatment may be performed in vacuum.

A treatment chamber for a plasma treatment and a treatment chamber for an ink-jetting step may be arranged adjacently, thereby making up a so-called multi chamber. Specifically, a multi chamber is preferable since a substrate having a surface to be treated can be transferred without being exposed to the atmosphere in the case of conducting a plasma treatment and an ink-jetting step in vacuum.

Figure 15B:
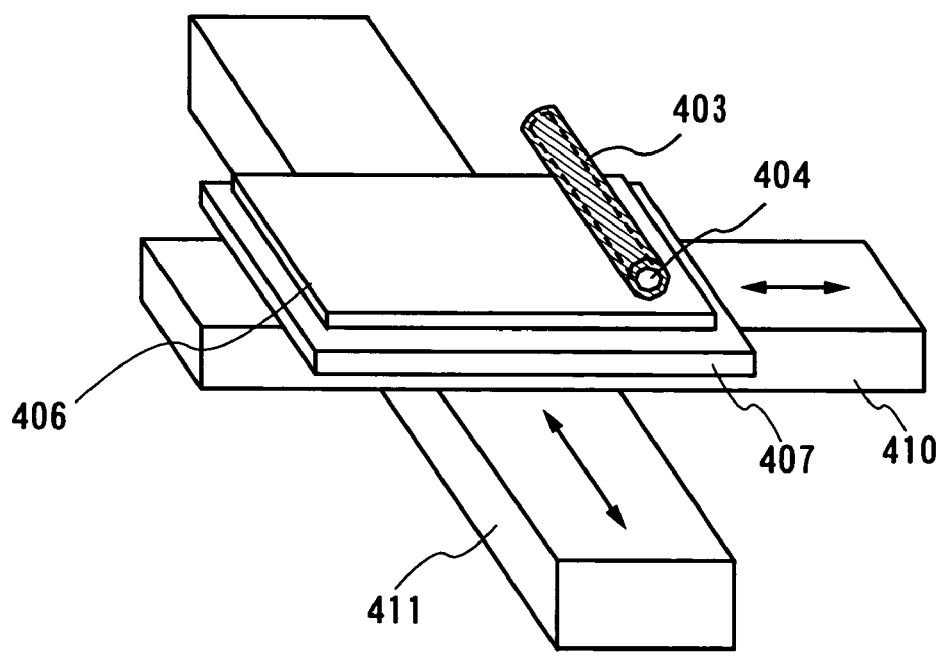

Moreover, it is not necessarily required to perform a plasma treatment in the treatment chamber since the plasma treatment can be conducted under atmospheric pressure or pressure in the neighborhood of atmospheric pressure, as shown in FIG. 15B.

An uniaxial robot 410 for an X-axis and an uniaxial robot 411 for a Y-axis are provided in FIG. 15B, and a stage 407 is provided over one of the robots. A substrate 406 having a surface to be treated is provided on the stage. The electrode 403 is cylindrical and a dielectric 404 covers the circumference of the electrode. Teflon (a registered trademark) is employed as the dielectric in this embodiment mode. Other plasma conditions are described above, and thus, description thereof is omitted.

When the plasma treatment is performed, the electrode and the substrate are relatively moved. When the substrate is larger than the electrode, the electrode and the substrate may be moved relatively. Alternatively, the electrode and the substrate may be moved relatively, while rotating the substrate. When they are moved in these ways, a position control may be conducted with a CCD camera or the like by an alignment marker or the like as a mark.

The plasma treatment can be easily conducted without vacuuming since the plasma treatment can be conducted in the atmosphere. Consequently, manufacturing time of a thin film transistor can be drastically shortened. Of course, the plasma treatment can be performed in vacuum.

[Embodiment Mode 7]

An example of forming a film containing fluorine as a liquid-repellent treatment, instead of a plasma treatment, is described in Embodiment Mode 7. Other manufacturing methods are referred to Embodiment Modes described above.

Figure 14A:
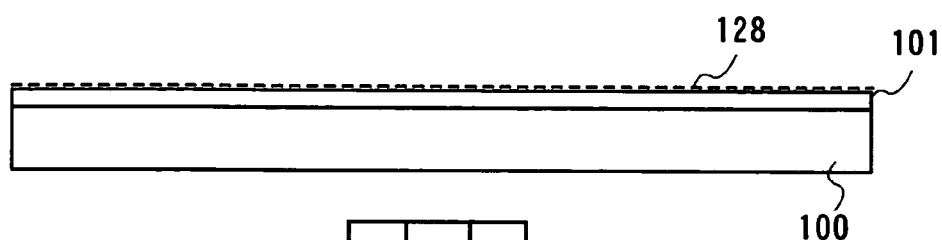
FIGS. 14A to 14C are each a cross-sectional view of a thin film transistor according to one aspect of the invention.

As shown in FIG. 14A, a base film 101 is formed on a substrate 100 having an insulating surface. After that, a film containing fluorine, e.g. a Teflon film 128 is formed. The Teflon film may be formed to be a single molecular layer level (monomolecular level), i.e. 5 nm or less in thickness. The Teflon film can be formed by sputtering, CVD or the like. In this embodiment mode, the Teflon film is used as the film containing fluorine, but a silane coupling agent or the like may be formed by a spin coating method.

Figure 14B:
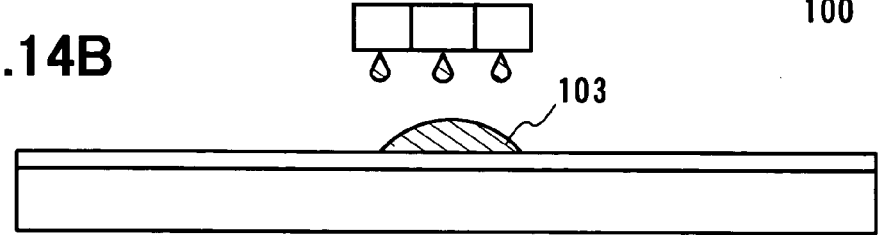

As shown in FIG. 14B, a conductive film functioning as a gate electrode 103 is formed on the Teflon film. The gate electrode can be formed by dropping a dot including a conductive material in a solution by an ink-jetting method. In this embodiment mode, a dot in which a conductor of silver (Ag) is dispersed in a solvent of tetradecane is dropped. As the result of forming the Teflon film, the gate electrode formed by an ink-jetting method can be miniaturized.

After that, a heat treatment for baking or drying is conducted when the solvent of the dot is required to remove. The formed Teflon film of a thickness at a monomolecular layer level (single molecular level) is removed by the heat treatment.

Figure 14C:
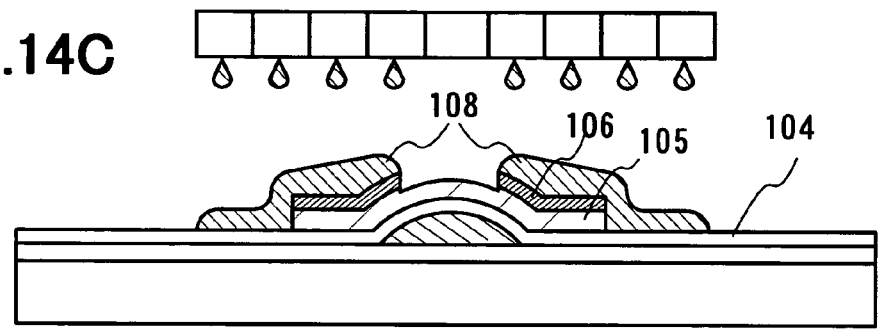

As shown in FIG. 14C, a gate insulating film 104, a semiconductor film 105, and a semiconductor film having N type conductivity 106 are formed sequentially and patterned into a desired shape. After that, a conductive film serving as a source and drain electrode 108 is formed. The Teflon film may be formed before forming the source and drain electrode.

A channel etch type thin film transistor shown in Embodiment Mode 1 is described in this embodiment mode, but a structure of a thin film transistor is not limited thereto. In other words, a Teflon film may be formed to have a liquid-repellent property in the methods for manufacturing a thin film transistor described in the embodiment modes described above.

As described above, a thin film transistor in which up to a source electrode and a drain electrode have been formed is completed. A substrate where such plural thin film transistors are formed is referred to as a TFT substrate.

In addition, as for the thusly obtained thin film transistor, a Teflon film is formed before forming a conductive film by an ink-jetting method. A Teflon film is formed before forming a gate electrode by an ink-jetting method in this embodiment mode, but the Teflon film may be formed before at least one ink-jetting step. Thus, a Teflon film may be formed before an ink-jetting step which is not shown in this embodiment mode. A plasma treatment described above may be performed in addition to the step of forming the Teflon film, before employing an ink-jetting method.

As described above, a thin film transistor having miniaturized gate, source and drain electrodes can be obtained by the step of forming a Teflon film before an ink-jetting step. Efficiency in the use of materials improves, and a cost and an amount of waste liquid can be reduced when a wiring, a mask or the like is formed by an ink-jetting method. In particular, steps in the case of forming a mask by an ink-jetting method can be more simplified than the case of a photolithography step. Consequently, reduction of costs such as a facility investment cost can be achieved, and manufacturing time can be shortened.

[Embodiment Mode 8]

An interlayer insulating film provided to cover a thin film transistor and a wiring that is formed in an opening (an opening portion) formed in the interlayer insulating film are described in Embodiment Mode 8.

Figure 5A:
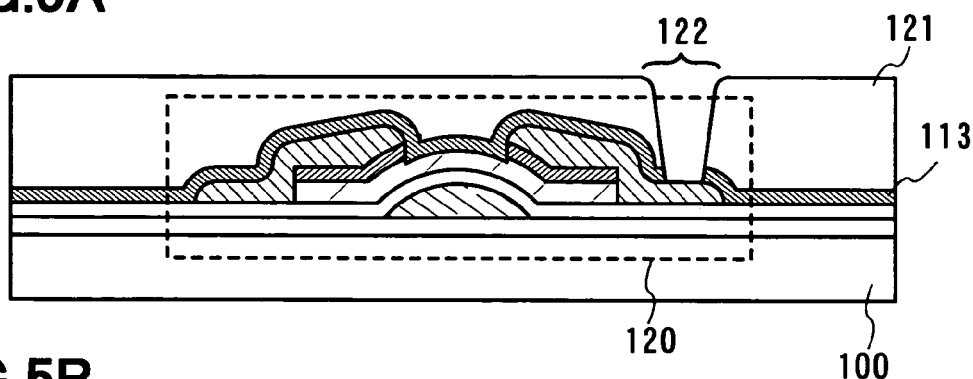
FIGS. 5A to 5C are each a cross-sectional view of a thin film transistor according to one aspect of the invention.

As shown in FIG. 5A, a thin film transistor (TFT) 120 having a protective film 113 is formed over a substrate 100 having an insulating surface, according to the embodiment modes described above. This embodiment mode describes a TFT as shown in Embodiment Mode 1, but any TFT described in the embodiment modes described above may be used.

An interlayer insulating film 121 is formed to cover the TFT 120. Accordingly, planarity can be increased. As the interlayer insulating film, an inorganic material (such as silicon oxide, silicon nitride, silicon oxynitride), a photosensitive or non-photosensitive organic material (polyimide, acryl, polyamide, polyimidamide, benzocyclobutene, or resist), siloxane, or polysilazane and a laminated structure thereof can be used. Siloxane is formed by using a polymeric material as a starting material, which has a skeleton formed by the bond of silicon (Si) and oxygen (O), and which includes at least hydrogen as a substituent, or further at least one of fluoride, alkyl group, and aromatic hydrocarbon as the substituent. Polysilazane is formed by using a liquid material including a polymeric material having a bond of silicon (Si) and nitrogen (Ni) as a start material. As an organic material, either positive type photosensitive organic resin or negative photosensitive organic resin may be used.

When planarity is increased, CMP or the like may be performed on an interlayer insulating film.

Figure 5B:
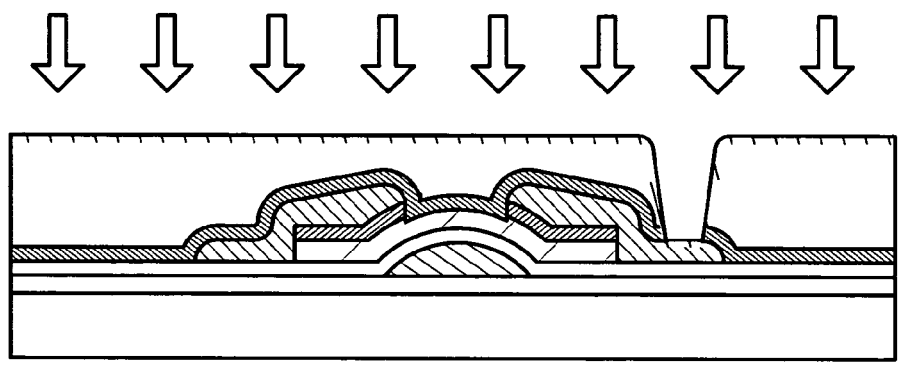

As shown in FIG. 5B, an opening 122 having a desired shape is formed at a desired position of the interlayer insulating film 121. A case of forming the opening with a tapered shape in a side face thereof in the interlayer insulating film over the source electrode and the drain electrode is described in this embodiment mode.

A mask is formed on the interlayer insulating film 121 and the opening is formed by etching by using the mask. The mask can be formed by an ink-jetting method or a photolithography method. In particular, the step of forming a mask by an ink-jetting method is more simplified than by a photolithography step. Therefore, reduction of costs such as a facility investment cost can be achieved, and manufacturing time can be shortened. At the time, a plasma treatment may be performed on the interlayer insulating film 121. Consequently, the mask formed by an ink-jetting method can be miniaturized.

Alternatively, the opening may be formed in the interlayer insulating film by dropping a dot including etchant by an ink-jetting method. When the opening is formed by an ink-jetting method, efficiency in the use of etchant is increased, reduction of a cost, reduction of waste liquid become possible. A photolithography step can be simplified when the opening is formed by an ink-jetting method.

A plasma treatment is performed on the interlayer insulating film 121 in which the opening is formed. As a result of this plasma treatment, surface modification of the interlayer insulating film and within the opening (including a side face of the opening) is made so as to be liquid-repellent, that is, low in wettability, to liquid such as oil or alcohol.

Figure 5C:
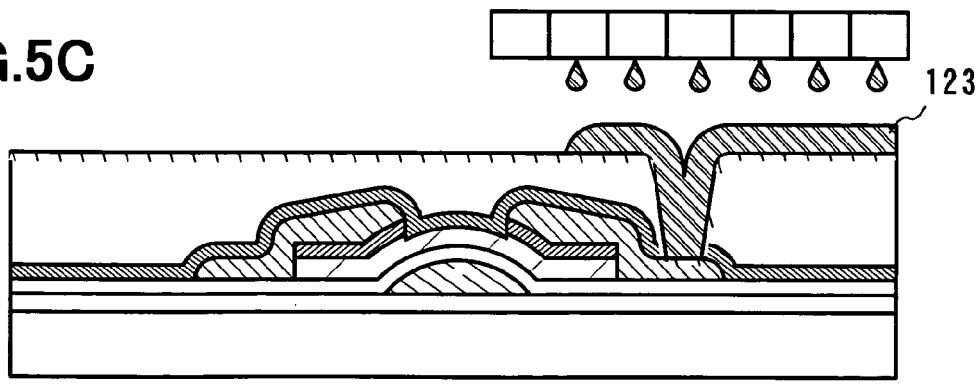

As shown in FIG. 5C, a wiring 123 is formed in the opening. The wiring 123 can be formed by a sputtering method or an ink-jetting method. In this embodiment mode, a dot in which a conductor of silver (Ag) is dispersed in a solvent of tetradecane is dropped to form the wiring. At the time, a surface of the interlayer insulating film and inside of the opening (including a side face of the opening) are liquid-repellent. Consequently, the wiring formed by an ink-jetting method can be miniaturized. After that, a heat treatment for baking or drying is conducted when the solvent of the dot is required to remove.

Figure 6A:
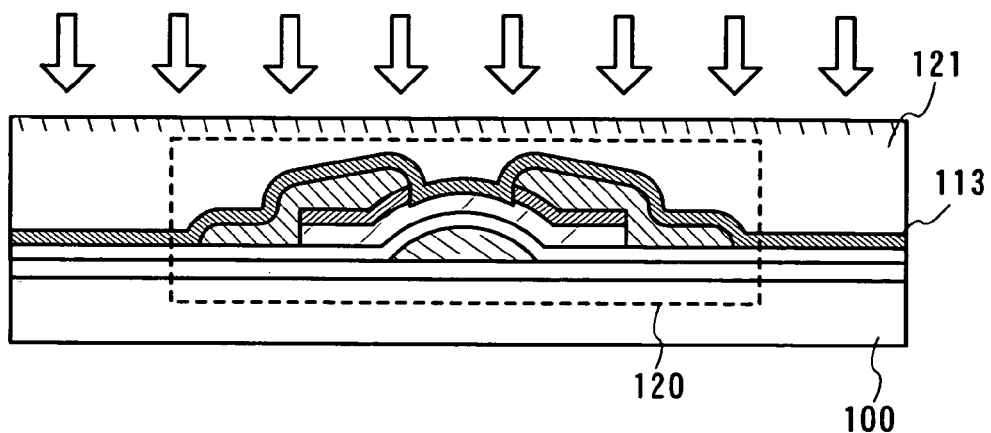
FIGS. 6A to 6C are each a cross-sectional view of a thin film transistor according to one aspect of the present invention.
Figure 6B:
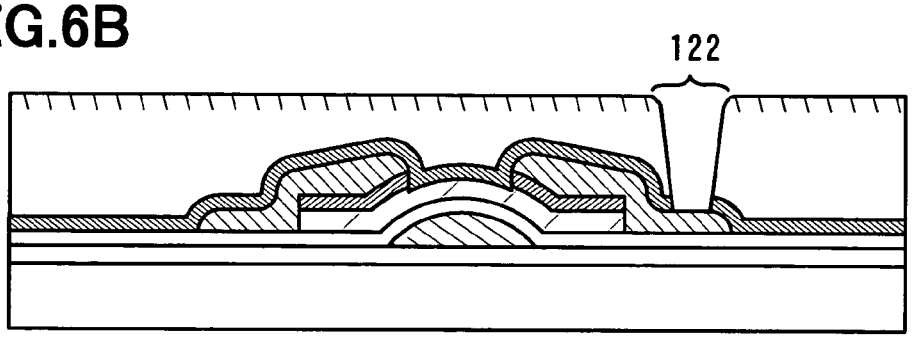
Figure 6C:
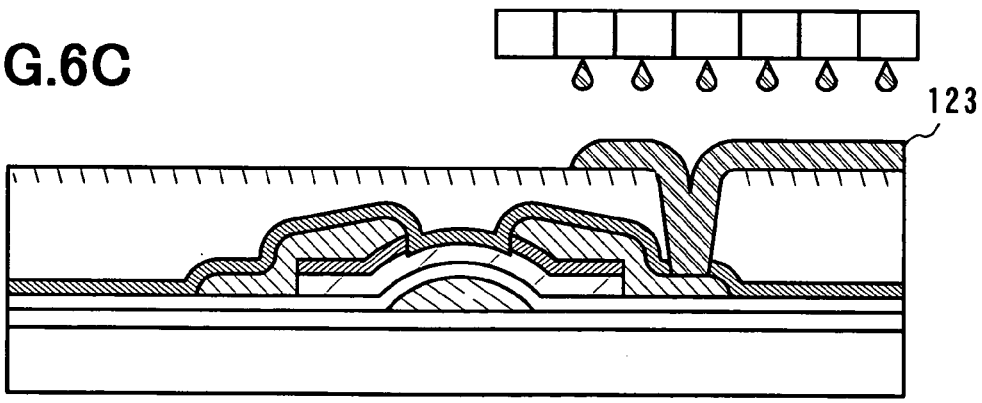

A case of forming an opening after performing a plasma treatment, which is different in timing for a plasma treatment, with reference to FIGS. 6A to 6C. Other structures are similar to those of FIGS. 5A to 5C, and thus detailed description thereof is omitted.

As shown in FIG. 6A, a thin film transistor 120 having a protective film 113 is formed on a substrate 100 having an insulating surface according to the embodiment modes described above.

An interlayer insulating film 121 is formed to cover a TFT 120 as in FIGS. 5A to 5C. As a result, planarity can be increased.

Initially, a plasma treatment is performed on the interlayer insulating film 121. As a result of this plasma treatment, surface modification of the interlayer insulating film is made so that the surface becomes be liquid-repellent, that is, low in wettability, to liquid such as oil or alcohol.

As shown in FIG. 6B, an opening 122 is formed to have a desired shape at a desired position of the interlayer insulating film 121.

A mask is formed on the interlayer insulating film 121 and an opening is formed by etching by using the mask. The mask can be formed by an ink-jetting method or a photolithography method. A photolithography step can be simplified when the opening is formed by an ink-jetting method. At the time, because a plasma treatment is performed on the interlayer insulating film 121, the mask formed by an ink-jetting method can be miniaturized.

Figure 20:
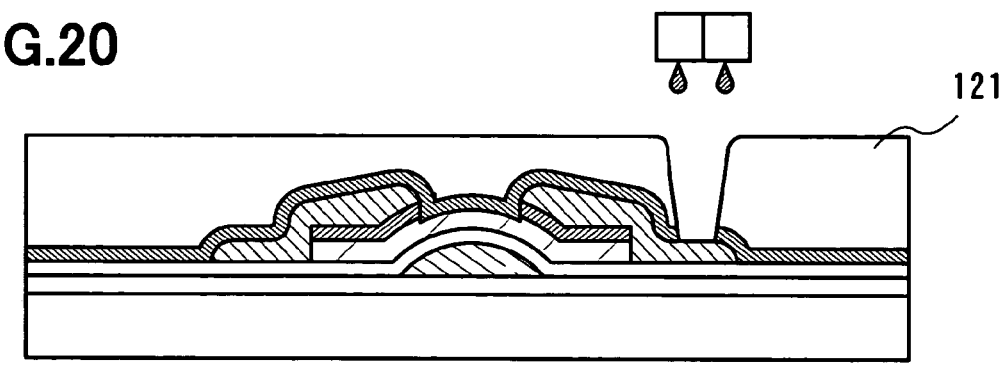
FIG. 20 is a cross-sectional view of a thin film transistor according to one aspect of the invention.

A dot including etchant may be dropped to form an opening in the interlayer insulating film by an ink-jetting method, as shown in FIG. 20. When an opening is formed by an ink-jetting method, efficiency in the use of etchant is improved, reduction of a cost, and reduction of waste liquid are possible. And a photolithography step can be simplified when the opening is formed by an ink-jetting method. As shown in FIG. 6C, a wiring 123 is formed in the opening. The wiring 123 can be formed by an ink-jetting method or a sputtering method. In this embodiment mode, a dot in which a conductor of silver (Ag) is dispersed in a solvent of tetradecane is dropped.

Because a surface of the interlayer insulating film 121 is liquid-repellent and the inside of an opening (including a side face of the opening) is not treated by the plasma treatment, the inside of the opening is less liquid-repellent than the surface. In other words, a dot having a wiring material shows a liquid-repellent property in the surface of the interlayer insulating film, whereas the inside of the opening (including a side face of the opening) shows a lyophilic property as compared with the surface of the interlayer insulating film. Consequently, a dot having a wiring material enters an opening more easily than the state shown in FIGS. 5A to 5C. Further, the wiring formed in the surface of the interlayer insulating film by an ink-jetting method can be miniaturized. It is preferable in the case of forming a wiring by an ink-jetting method to control a liquid-repellent property and a lyophilic property After that, a heat treatment for baking or drying is conducted when the solvent of the dot is required to remove.

Figure 21A:
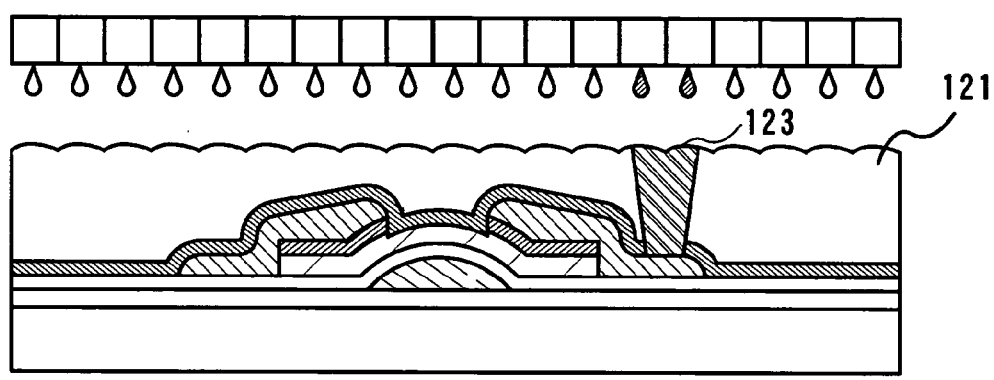
FIGS. 21A and 21B are each a cross-sectional view of a thin film transistor according to one aspect of the invention.
Figure 21A:
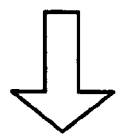
Figure 21B:
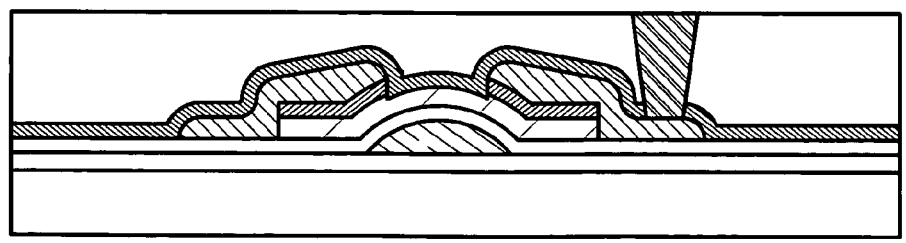

As shown in FIG. 21A, a material of an interlayer insulating film and a material of a wiring may be dropped by an ink-jetting method to form the wiring 123. In this case, surfaces of the interlayer insulating film of the wiring may be polished by CMP or the like to improve the planarity as shown in FIG. 21B.

As for the thusly obtained thin film transistor, a plasma treatment is performed before forming the wiring on the interlayer insulating film by an ink-jetting method. In this embodiment mode, the plasma treatment is performed before or after forming the opening, but the plasma treatment may be performed before and after forming the opening.

When the wiring formed in the opening and other wirings (e.g., signal line) are formed by an ink-jetting method, the wirings can be miniaturized by performing a plasma treatment on the interlayer insulating film.

As described above, a thin film transistor having the miniaturized wiring formed on the interlayer insulating film can be obtained by the plasma treatment before an ink-jetting step.

[Embodiment Mode 9]

A method of forming a pixel electrode is shown in Embodiment Mode 9.

Figure 7A:
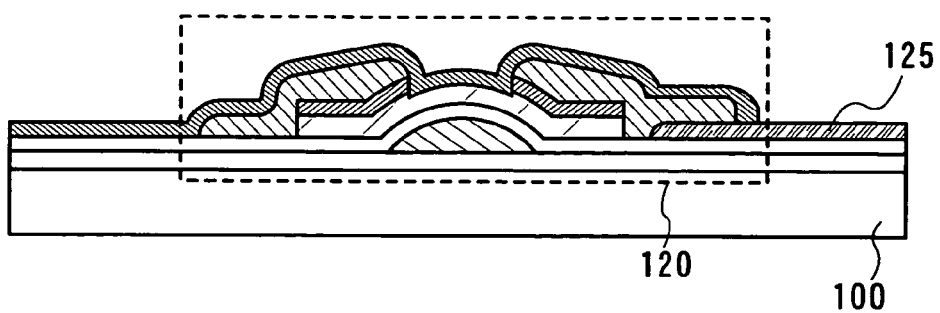
FIGS. 7A to 7C are each a cross-sectional view of a thin film transistor according to one aspect of the invention.

As shown in FIG. 7A, a thin film transistor 120 having a protective film 113 is formed on a substrate 100 having an insulating surface. This embodiment mode describes a TFT as shown in Embodiment Mode 1, but any TFT described in Embodiment Modes above may be used. A case of forming a pixel electrode 125 to be connected to a source electrode and a drain electrode in a lower portion of the electrodes is described.

After forming a gate insulating film, a semiconductor film and a semiconductor film having N type conductivity are patterned to form the pixel electrode in the area for forming the source electrode or the drain electrode. The pixel electrode can be formed by a sputtering method or an ink-jetting method. The pixel electrode is made of a light-transmitting material or a non-light transmitting material. For example, an ITO and the like can be used in the case of a light-transmitting material, whereas a metal film can be used in the case of a non-light transmitting material. An ITO (indium tin oxide), an IZO (indium zinc oxide) in which zinc oxide (ZnO) of 2% to 20% is mixed into indium oxide, ITO-SiOx in which silicon oxide ($SiO_2$) of 2% to 20% is mixed into indium oxide (referred to as ITSO or NITO for convenience), an organic indium, an organotin, a titanium nitride (TiN), and the like can also be used as specific examples of the pixel electrode.

Specifically, when the pixel electrode is formed by an ink-jetting method, a plasma treatment may be performed on the gate insulating film which is a surface for forming the pixel electrode. As the result of this plasma treatment, surface modification is made so that the surface becomes liquid-repellent, that is, low in wettability, to liquid such as alcohol or oil.

In FIG. 7A, a dot dispersed with a conductor of ITO is dropped by an ink-jetting method to form a pixel electrode. As a result of the plasma treatment, the pixel electrode formed by an ink-jetting method can be miniaturized. After that, a heat treatment for baking or drying is conducted when the solvent of the dot is required to remove.

Figure 7B:
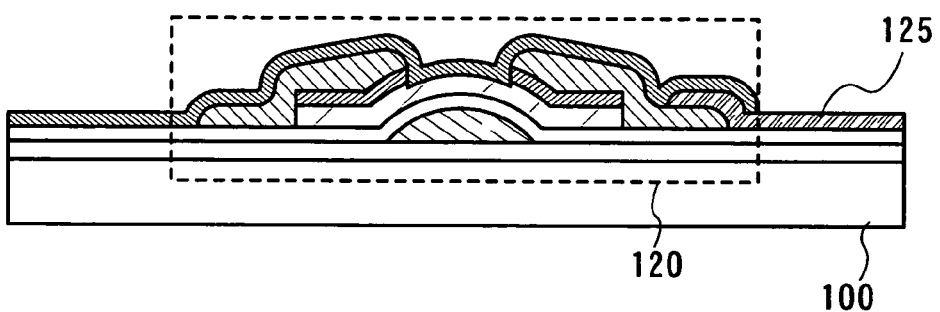

FIG. 7B shows an example of forming a pixel electrode on a source electrode or a drain electrode, which is different from that of FIG. 7A. The pixel electrode can be formed by a sputtering method or an ink-jetting method, as described above. Specifically, when the pixel electrode is formed by an ink-jetting method, a plasma treatment may be performed on the source electrode, the drain electrode and the gate insulating film that are each a surface forming the pixel electrode. As the result of this plasma treatment, surface modification is made so that the surface becomes liquid-repellent, that is, low in wettability, to liquid such as alcohol or oil.

In FIG. 7B, a dot dispersed with a conductor of ITO is dropped to form the pixel electrode by an ink-jetting method. As a result of the plasma treatment, the pixel electrode formed by an ink-jetting method can be miniaturized. After that, a heat treatment for baking or drying is conducted when the solvent of the dot is required to remove.

Figure 7C:
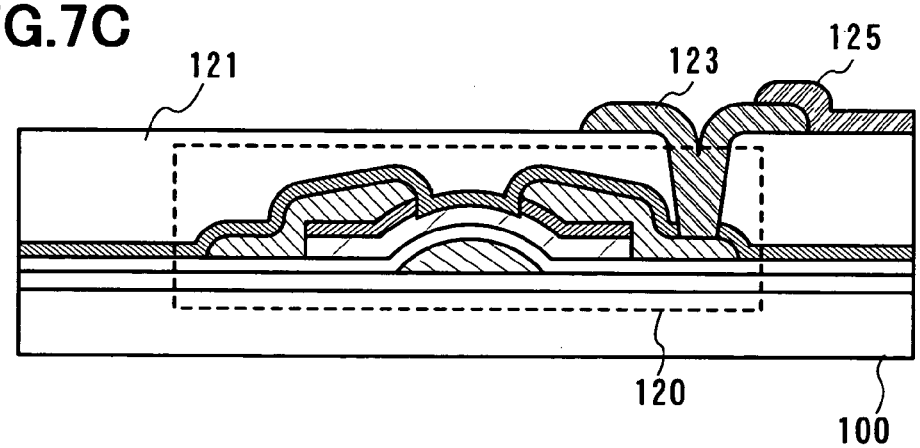

In FIG. 7C, an interlayer insulating film 121 is formed and planarized, and then, a wiring 123 is formed and connected to a pixel electrode, which is different from in FIGS. 7A and 7B. The pixel electrode can be formed by a sputtering method or an ink-jetting method, as mentioned above. Specifically, when the pixel electrode is formed by an ink-jetting method, a plasma treatment may be performed on the interlayer insulating film which is a surface forming the pixel electrode after forming a wiring 123. As the result of this plasma treatment, surface modification is made so that the surface becomes liquid-repellent, that is, low in wettability, to liquid such as alcohol or oil.

In FIG. 7C, an ITSO is employed as the pixel electrode. The ITSO can be formed by dropping a dot dispersed with a conductor of ITO and silicon by an ink-jetting method. Alternatively, it can be formed by a sputtering method using an ITO containing silicon as a target. At the time, siloxane may be employed for the interlayer insulating film 121. Further, an insulating film containing nitrogen 126, e.g. silicon nitride or silicon oxynitride may be formed on the interlayer insulating film of siloxane. When a light-emitting element having such a structure is formed, light-emitting intensity and an endurance time can be improved. When acryl or polyimide is used for the interlayer insulating film 121, the insulating film containing nitrogen 126 can be eliminated. In such a structure, a liquid element may be formed.

When the pixel electrode is formed by an ink-jetting method, as a result of the plasma treatment, the pixel electrode can be miniaturized. After that, a heat treatment for baking or drying is conducted when the solvent of the dot is required to remove.

In this way, when the pixel electrode is formed by an ink-jetting method, a plasma treatment is preferably performed on a surface for forming the pixel electrode.

As described above, by a plasma treatment before an ink-jetting step, a thin film transistor having a miniaturized pixel electrode can be obtained.

A TFT substrate in which up to a pixel electrode has been formed is referred to as a module TFT substrate.

[Embodiment Mode 10]

A display device (a liquid crystal display device) including a liquid crystal module having a thin film transistor shown in the embodiment modes described above is described in Embodiment Mode 10.

Figure 8:
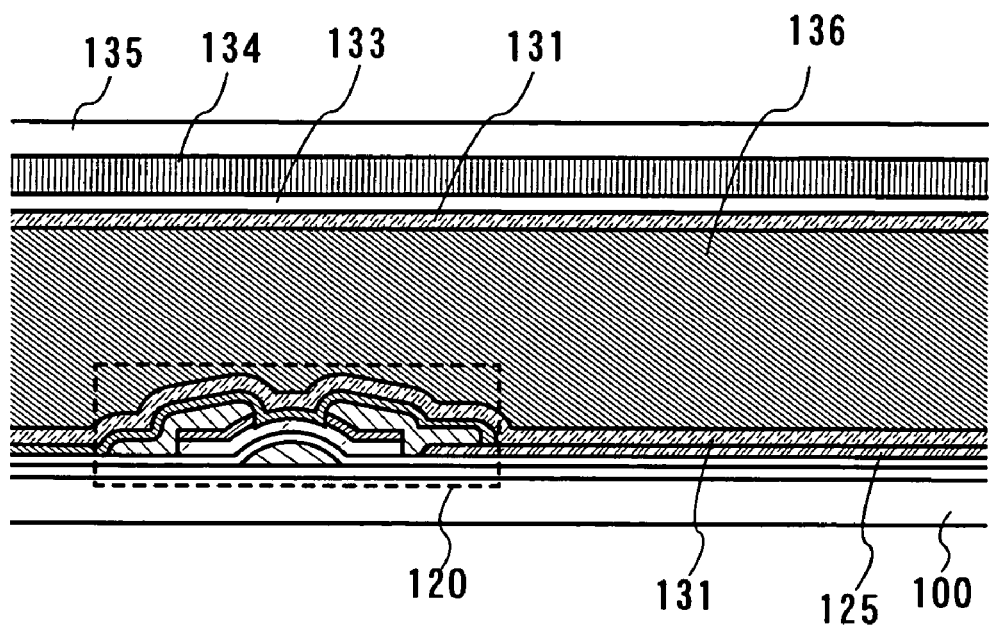
FIG. 8 is a cross-sectional view showing a liquid crystal display device according to one aspect of the invention.

FIG. 8 is a cross-sectional view of a liquid crystal display device having a thin film transistor 120 and a pixel electrode 125 formed over a TFT substrate as described in the embodiment modes. When a light-transmitting conductive film (such as ITO or ITSO) is used for the pixel electrode 125, a transmissive liquid crystal display device can be obtained.

On the contrary, when a non light-transmitting film, that is, a high-reflective film (e.g., aluminum) is used, a reflective liquid crystal display device can be obtained. A module TFT substrate used for a liquid crystal display device like this embodiment mode is referred to as a liquid crystal module TFT substrate.

An orientation film 131 is formed to cover the thin film transistor 120, a protective film 113, and the pixel electrode 125.

A color filter 134, an opposite electrode 133, and the orientation film 131 are formed sequentially over an opposite substrate 135. The color filter, the opposite electrode or the orientation film can be formed by an ink-jetting method. Although not shown, a black matrix may be also formed by an ink-jetting method.

After that, the substrate 100 is attached to the opposite substrate 135 by a sealing material and a liquid crystal is injected thereinto to form a liquid crystal layer 136, thereby obtaining a liquid crystal module. When the liquid crystal is injected, a treatment chamber that is to be in a vacuum state is required.

Note that a liquid crystal may be dropped and an ink-jetting method may be employed for the dropping method of a liquid crystal. In particular, in the case of a large-size substrate, a liquid crystal is preferably dropped. This is because a larger treatment chamber is required, a substrate weighs more and a treatment is more difficult as a substrate becomes larger, in the case of a liquid crystal injection method.

When a liquid crystal is dropped, a sealing material is formed in the periphery of one substrate. The reason why one substrate is described is that the sealing material may be formed in either the substrate 100 or the opposite substrate 135. At the time, the sealing material is formed in the closed area where the end point is accorded with the initial point of the sealing material. After that, one drop or more drops of liquid crystals is/are dropped. In the case of a large-size substrate, plural drops of liquid crystals are dropped in plural portions. Then, the substrate is attached to the other substrate in vacuum. This is because it is possible to remove unnecessary air and to prevent a sealing material from being broken and expanded due to air, by making the vacuum state.

Then, two or more points in the region where the sealing material is formed are solidified and bonded for temporary attachment. Two or more points in the region where the sealing material is formed may be irradiated with ultraviolet rays, when ultraviolet curable resin is used for the sealing material. After that, the substrate is taken out of the treatment chamber, and the whole sealing material is solidified and bonded so as to completely be attached. At the time, a light-shielding material is preferably arranged so that a thin film transistor or a liquid crystal may not be irradiated with ultraviolet rays.

A pillar like or spherical spacer may be used as well as the sealing material so as to keep the gap between the substrates.

In this manner, a liquid crystal module is completed.

After that, an external terminal may be connected to a signal line driver circuit or a scanning line driver circuit by bonding an FPC (Flexible Printed Circuit) using anisotropic conductive film. Further, the signal line driver circuit or the scanning line driver circuit may be formed as an external circuit.

In this manner, a liquid crystal display device in which a thin film transistor having a miniaturized wiring is provided and to which an external terminal is connected, can be formed.

In this embodiment mode, a very thin liquid crystal display device can be formed, since the thin film transistor does not include an interlayer insulating film.

An interlayer insulating film may be formed to increase planarity, as shown in the above embodiment modes, in this embodiment mode. When the planarity is increased, an orientation film can be formed uniformly and voltage can be applied to a liquid crystal layer uniformly, which is preferable.

As the interlayer insulating film, an inorganic material (such as silicon oxide, silicon nitride, silicon oxynitride), a photosensitive or non-photosensitive organic material (such as polyimide, acryl, polyamide, polyimidamide, benzocyclobutene or resist), siloxane, polysilazane and a laminated structure thereof can be used. As the organic material, positive type photosensitive organic resin or negative photosensitive organic resin can be used.

[Embodiment Mode 11]

A display device (a light emitting device) having a light emitting module including a thin film transistor shown in the above described embodiment modes is described in Embodiment Mode 9.

Figure 10:
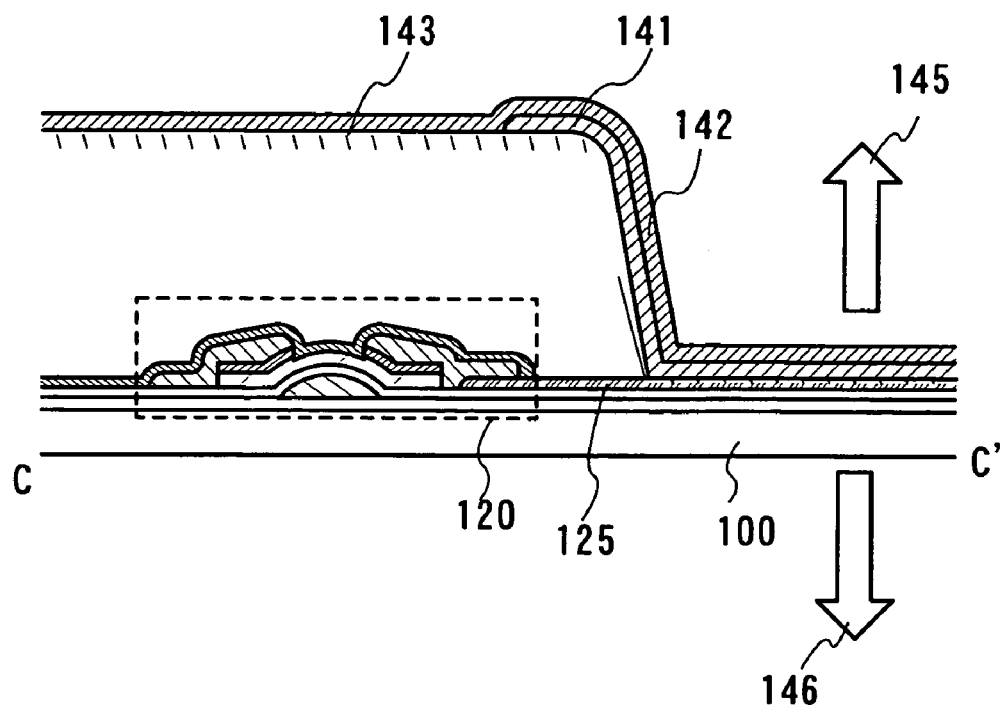
FIG. 10 is a cross-sectional view of a light-emitting device, according to one aspect of the invention.

FIG. 10 is a cross-sectional view of a light emitting device having a thin film transistor 120 and a pixel electrode 125 formed in the TFT substrate shown in the foregoing embodiment modes.

The thin film transistor 120 having the pixel electrode 125 is formed as shown in the above embodiment modes. The pixel electrode 125 functions as a first electrode of a light-emitting element.

After that, an insulating film 143 functioning as a bank or a barrier is formed over the first electrode. As the insulating film, an inorganic material (such as silicon oxide, silicon nitride, silicon oxynitride), a photosensitive or non-photosensitive organic material (such as polyimide, acryl, polyamide, polyimidamide, benzocyclobutene or resist), siloxane, polysilazane and a laminated structure thereof can be used. As the organic material, positive photosensitive organic resin or negative photosensitive organic resin can be used. For example, in the case of using positive photosensitive acrylic as the organic material, the photosensitive organic resin is etched by light-exposure to form an opening with a curvature in the upper edge portion. This can prevent an electroluminescent layer to be formed later or the like from being disconnected. The TFT substrate in this state is referred to as a light emitting module TFT substrate.

An electroluminescent layer 141 is formed in the opening of the insulating film 143 formed over the first electrode. Surface modification may be performed by a plasma treatment before forming the electroluminescent layer. In this embodiment mode, a plasma treatment is performed on the opening of the insulating film 143 and the electroluminescent layer having a high molecular weight (polymeric) material is formed by an ink-jetting method.

Thereafter, a second electrode 142 of the light-emitting element is formed to cover the electroluminescent layer 141 and the insulating film 143.

A singlet excited state and a triplet excited state are possible as a kind of the molecular exciton formed by an electroluminescent layer. A ground state is generally a singlet excited state, and light emission from a singlet excited state is referred to as fluorescence. Light emission from a triplet excited state is referred to as phosphorescence. Light-emission from an electroluminescent layer includes light emission by the both excited states. Further, fluorescence and phosphorescence may be combined, and either of them can be selected depending on luminescence property (such as light-emitting intensity or an endurance time) of respective RGB.

The electroluminescent layer 141 is formed by laminating in order HIL (hole injecting layer), HTL (hole transporting layer), EML (light emitting layer), ETL (electron transporting layer), EIL (electron injecting layer) sequentially from the first electrode side corresponding to the pixel electrode 125. Note that the electroluminescent layer can employ a single layer structure or a combined structure other than a laminated structure.

Materials for light emission of red (R) green (G) and blue (B) are each selectively formed by a vapor deposition method using a vapor-deposition mask, or the like for the electroluminescent layer 141. The materials for light emission of red (R) green (G) and blue (B) can be formed also by an ink-jetting method, and this case is preferable since it is possible to individually apply each RGB without using a mask.

Specifically, CuPc or PEDOT for HIL, α-NPD for HTL, BCP or Alq$_3$ for ETL and BCP: Li or CaF$_2$ for EIL are used respectively. Alq$_3$ doped with a dopant corresponding to each light emission of RGB (DCM or the like for R, DMQD or the like for G) may be used for EML, for example.

Note that the electroluminescent layer is not limited to the above material. For example, a hole injection property can be enhanced by co-evaporating oxide such as molybdenum oxide (MoOx: x=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer.

In the case of forming the electroluminescent layer of each RGB, high-definition display can be performed by using a color filter. This is because a broad peak can be corrected to be sharp in light emitting spectrum of each RGB by the color filter.

The case of forming materials for light emission of each RGB is described above, but a material for monochrome light emission is formed and a color filter or a color conversion layer is combined to display with full color. For example, when an electroluminescent layer for light emission of white or orange is formed, a color filter, or a color filter combined with a color conversion layer is provided separately to obtain a full color display. A color filter or a color conversion layer may be formed on a second substrate (sealing substrate), for example, and attached to a substrate. A material for monochrome light emission, a color filter, and a color conversion layer can be each formed by an ink-jetting method.

A display of monochrome light emission may be performed. For example, an area color type display device may be formed by using monochrome light emission. A passive matrix display portion is suitable for the area color type, which can mainly display characters and symbols.

In addition, it is necessary to select materials of the first electrode 125 and the second electrode 142 in consideration of the work function. However, the first electrode and the second electrode can be an anode or a cathode depending on a pixel structure. It is preferable that the first electrode is a cathode and the second electrode is an anode in this embodiment mode, since the polarity of a driving TFT is an N channel type. On the contrary, it is preferable that the first electrode is an anode and the second electrode is a cathode when the polarity of the driving TFT is a P channel type.

Hereinafter, electrode materials used for the anode and the cathode are described.

It is preferable to use a metal, an alloy, a conductive compound, a mixture thereof, or the like having a high work function (work function: 4.0 eV or more) as an electrode material used for the anode. ITO (indium tin oxide), IZO (indium zinc oxide) in which zinc oxide (ZnO) of from 2% to 20% is mixed into indium oxide, ITSO in which silicon oxide (SiO$_2$) of from 2% to 20% is mixed into indium oxide, gold, platinum, nickel, tungsten, chromium, molybdenum, iron, cobalt, copper, palladium, a nitride of a metal material (such as titanium nitride) and the like can be cited as a specific material.

On the other hand, it is preferable to use a metal, an alloy, a conductive compound, a mixture thereof, or the like having a low work function (work function: 3.8 eV or less) as an electrode material used for the cathode. An element belonging to Group 1 or 2 in the periodic table, that is, an alkaline metal such as lithium or cesium, an alkaline earth metal such as magnesium, calcium, or strontium, an alloy (Mg:Ag or Al:Li) or a compound (LiF, CsF, or CaF$_2$) including them, or a transition metal including a rare-earth metal can be cited as a specific material.

The second electrode can be formed by extremely thinly forming such a metal or an alloy including such a metal and by laminating ITO, IZO, ITSO, or another metal (including an alloy) thereover, when the second electrode is required to be light transmitting in this embodiment mode.

The first electrode and the second electrode can be formed by a vapor deposition method, a sputtering method, an ink-jet method, or the like.

In the case of forming a conductive film, ITO or ITSO, or a laminated body thereof as the second electrode by a sputtering method, the electroluminescent layer may be damaged from the sputtering. In order to reduce damages from the sputtering method, an oxide such as molybdenum oxide (MoOx: x=2 to 3) is preferably formed on a top surface of the electroluminescent layer. Therefore, oxide such as molybdenum oxide (MoOx: x=2 to 3) which functions as HIL or the like is formed on a top face of the electroluminescent layer. An EIL (electron injecting layer), an ETL (electron transporting layer), an EML (light emitting layer), an HTL (hole transporting layer), an HIL (hole injecting layer), and the second electrode may be laminated in this order from a side of the first electrode. At this time, the first electrode functions as a cathode and the second electrode functions as an anode.

Since the polarity of the driving TFT is an N channel type in this embodiment mode, it is preferable to employ a structure of the first electrode that is a cathode, EIL (electron injecting layer), ETL (electron transporting layer), EML (light emitting layer), HTL (hole transporting layer), HIL (hole injecting layer), and the second electrode that is an anode in consideration of a moving direction of an electron.

Thereafter, a passivation film containing nitrogen, a DLC (Diamond like carbon), or the like may be formed by a sputtering method or a CVD method. Accordingly, penetration of moisture and oxygen can be prevented. In addition, penetration of oxygen or moisture can be prevented by covering a side face of a display device with the first electrode, the second electrode, or another electrode. Subsequently, a sealing substrate is attached. A space formed by the sealing substrate may be encapsulated with nitrogen or may be provided with a desiccant agent. In addition, light transmitting and highly water-absorbing resin may be filled therein. The sealing structure is described in detail in an embodiment mode hereafter.

A light emitting module is completed in this manner.

In the light emitting module, when the first electrode and the second electrode are formed to be light-transmitting, light is emitted from the electroluminescent layer in the directions shown by both arrows 145 and 146, with a brightness corresponding to a video signal inputted from a single line. When the first electrode is light-transmitting and the second electrode is not light-transmitting, light is emitted only in the direction of the arrow 146. When the first electrode is not light-transmitting and the second electrode is light-transmitting, light is emitted only in the direction of the arrow 145. At the time, light can be efficiently utilized by using a highly reflective conductive film as the non-light-transmitting electrode provided on a side which is not a light emitting direction.

In this embodiment mode, a non-light-transmitting conductive film may be formed to be thin enough to transmit light and a light-transmitting conductive film may be laminated thereover, so as to obtain a conductive film having a light-transmitting property.

After that, an external terminal may be connected to a signal line driver circuit or a scanning line driver circuit by bonding an FPC using anisotropic conductive film. Further, the signal line driver circuit or the scanning line driver circuit may be formed as an external circuit.

Like this, a light-emitting display device in which a thin film transistor having a miniaturized wiring is provided and to which an external terminal is connected, can be formed.

In this embodiment mode, a very thin light-emitting display device can be formed, since the thin film transistor does not include an interlayer insulating film.

An interlayer insulating film may be formed to increase planarity, as shown in the above embodiment modes, in this embodiment mode. It is preferable that the planarity is increased and thus, voltage can be applied to an electroluminescent layer uniformly.

As the interlayer insulating film, an inorganic material (such as silicon oxide, silicon nitride, silicon oxynitride), a photosensitive or non-photosensitive organic material (such as polyimide, acryl, polyamide, polyimidamide, benzocyclobutene or resist), siloxane, polysilazane and a laminated structure thereof can be used. As the organic material, positive type photosensitive organic resin or Negative photosensitive organic resin can be used.

Figure 9A:
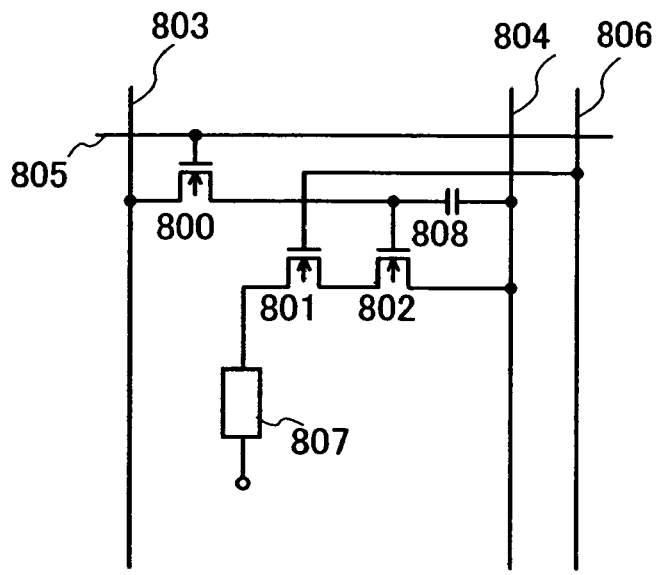
FIGS. 9A and 9B are an equivalent circuit diagram and a top view each showing a pixel of a light emitting device, respectively, according to one aspect of the invention.

FIG. 9A illustrates an equivalent circuit diagram of a pixel portion of a light emitting device. One pixel includes a TFT for switching (switching TFT) 800, a TFT for driving (driving TFT) 801, and a TFT for controlling current (current controlling TFT) 802. Theses TFTs are N channel types. One electrode and a gate electrode of the switching TFT 800 are connected to a signal line 803 and a scanning line 805, respectively. One electrode of the current controlling TFT 802 is connected to a first power supply line 804, and a gate electrode thereof is connected to the other electrode of the switching TFT.

A capacitor element 808 may be provided to hold gate-source voltage of the current controlling TFT. In this embodiment mode, when electric potential of the first power supply line is low and that of a light emitting element is high, the current controlling TFT is an N channel type. Therefore, the source electrode and the first power supply line are connected. Therefore, the capacitor element can be provided between the gate electrode and a source electrode of the current controlling TFT that is, the first power supply line. When the switching TFT, the driving TFT, or the current controlling TFT has a high gate capacitance and leak current from each TFT is permissible, the capacitor element 808 is not necessarily provided.

One electrode of the driving TFT 801 is connected to the other electrode of the current controlling TFT, and the gate electrode is connected to a second power supply line 806. The second power supply line 806 has a fixed electric potential. Therefore, a gate electric potential of the driving TFT can be fixed, and the driving TFT can be operated so that gate-source voltage Vgs is not changed by parasitic capacitance or wiring capacitance.

Then, a light emitting element 807 is connected to the other electrode of the driving TFT. In this embodiment mode, when an electric potential of the first power supply line is low and that of the light emitting element is high, a cathode of the light emitting element is connected to a drain electrode of the driving TFT. Therefore, it is preferable to sequentially laminate a cathode, an electroluminescent layer and an anode. At this time, in order to reduce damages from sputtering in forming the second electrode, an oxide such as a molybdenum oxide (MoOx: x=2 to 3) is preferably formed on a top surface of the electroluminescent layer. Therefore, it is more preferable to form oxide such as molybdenum oxide (MoOx: x=2 to 3) which functions as an HIL or the like on a top surface of the electroluminescent layer. In this way, in the case of a TFT having an amorphous semiconductor film and an N channel type, it is preferable to connect the drain electrode of the TFT and the cathode and to laminate an EIL, an ETL, an EML, an HTL, an HIL, and anode in this order.

Hereinafter, operation of such a pixel circuit is described.

When the scanning line 805 is selected and the switching TFT is turned ON, charges begin to be stored in the capacitor element 808. The charges are stored in the capacitor element 808 until they become equal to gate-source voltage of the current controlling TFT. When they are equal, the current controlling TFT is turned ON, and then, the driving TFT that is serially connected is turned ON. At this time, the gate potential of the driving TFT is fixed. Therefore, constant gate-source voltage Vgs which does not depend on the parasitic capacitance or the wiring capacitance can be applied to the light emitting element. In other words, current by the constant gate-source voltage Vgs can be supplied.

Since the light emitting element is a current driving type element, it is preferable to employ analog driving when characteristic variation of the TFT in the pixel, specifically, Vth variation is small. As in this embodiment mode, a TFT having an amorphous semiconductor film has small characteristics variation; therefore, analog driving can be employed. On the other hand, current at a constant value can be supplied to the light emitting element, also in the case of digital driving, by operating the driving TFT in a saturation region (a region satisfying |Vgs−Vth|<|Vds|).

Figure 9B:
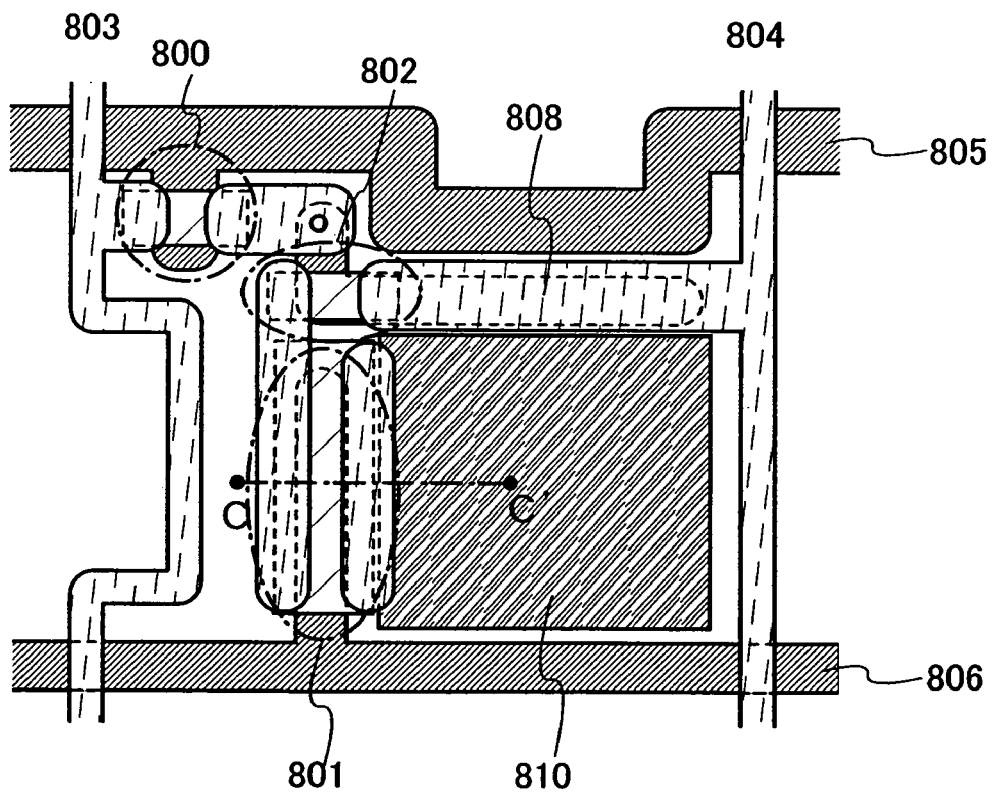

FIG. 9B shows an example of a top view of a pixel portion having the above equivalent circuit.

A gate electrode, a scanning line, and a second power supply line of each TFT are formed from the same conductive film over a base film by an ink-jetting method or a sputtering method. When the gate electrode or the like is formed by an ink-jetting method, a plasma treatment is performed on the base film that is a surface for forming the gate electrode or the like. As the result of this plasma treatment, surface modification is made so that the surface becomes liquid-repellent, that is, low in wettability, to liquid such as alcohol or oil. Consequently, the gate electrode, the scanning line and the second power supply line that are formed by an ink-jetting method can be miniaturized.

Although not shown, a gate insulating film is formed after that.

A first electrode 810 of the light emitting element 807 is formed on the gate insulating film. The first electrode 810 can be formed by an ink-jetting method, a sputtering method or the like. When the first electrode is formed by an ink-jetting method, a plasma treatment is conducted on the gate insulating film that is a surface for forming the first electrode. As the result of this plasma treatment, surface modification is made so that the surface becomes liquid-repellent, that is, low in wettability, to liquid such as alcohol or oil. Consequently, the first electrode formed by an ink-jetting method can be miniaturized.

Then, a semiconductor film is formed. The semiconductor film is formed over the entire surface by plasma CVD and pattered into a desired shape using a mask in this embodiment mode. A semiconductor film having N type conductivity may be formed on the semiconductor film, namely the semiconductor film and the semiconductor film having N type conductivity can be continuously formed.

After that, the conductive film formed by sputtering or CVD is patterned to form a source wiring, a drain wiring, a signal line and a first power supply line. A mask used in patterning can be formed by an ink-jetting method or a photolithography method.

The source wiring, the drain wiring, the signal line and the first power supply line can be formed by an ink-jetting method. When the source wiring, the drain wiring, the signal line and the first power supply line are formed by an ink-jetting method, a plasma treatment is conducted on a surface for each forming the source wiring, the drain wiring, the signal line and the first power supply line. As the result of this plasma treatment, surface modification is made so that the surface becomes liquid-repellent, that is, low in wettability, to liquid such as alcohol or oil. Consequently, the source wiring, the drain wiring, the signal line and the first power supply line formed by an ink-jetting method can be miniaturized.

In this embodiment mode, the capacitor element 808 is formed from the gate wiring and the source and drain wiring which are formed with the gate insulating film therebetween.

In this embodiment mode, a channel width (W) of the driving TFT may be designed to be large, since the driving TFT includes an amorphous semiconductor film.

In this way, a pixel portion of the light-emitting device can be formed.

A cross-sectional view of C–C' of FIG. 9B is shown in FIG. 10.

The active matrix light-emitting device like this is effective since a TFT is provided for every pixel and thus it can be driven with low voltage, when a pixel density is increased.

Although this embodiment mode shows an active matrix light-emitting device in which each TFT is formed in one pixel, a passive matrix light emitting device in which a TFT is formed in every column can be also formed. In the passive matrix light emitting device, a high aperture ratio can be obtained since a TFT is not provided for every pixel. In a light emitting device in which light is emitted toward opposite sides of an electroluminescent layer, light transmittance can be increased by employing a passive matrix light emitting device.

[Embodiment Mode 12]

A mode of a display device such as a light emitting device or a liquid crystal display device connected with an external terminal is described in Embodiment Mode 12.

Figure 11:
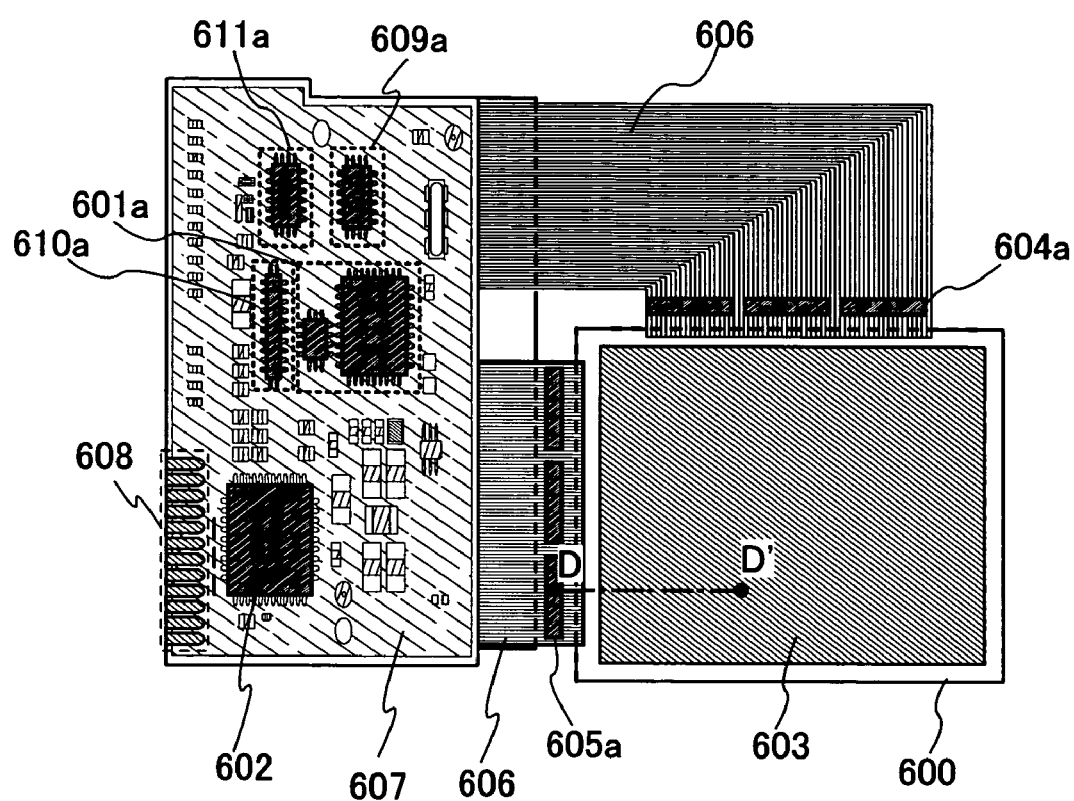
FIG. 11 is a top view of a display device according to one aspect of the present invention.

FIG. 11 shows an appearance of a display device on which a control circuit 601a and a power supply circuit 602 are mounted. A pixel portion 603 in which a light emitting element or a liquid crystal element is provided for every pixel is formed on a substrate 600. A thin film transistor in the pixel portion 603 can be formed to have a wiring or the like that is miniaturized as in the foregoing embodiment modes. A scanning line driver circuit 604a for selecting a pixel of the pixel portion 603 and a signal line driver circuit 605a for supplying a video signal to the selected pixel are mounted by an IC chip. Widths of long and short sides of an IC to be mounted or the number thereof is not limited to those described in this embodiment mode. The scanning line driver circuit or the signal line driver circuit may be integrally formed with the pixel portion.

The control circuit 601a, the power supply circuit 602, an image signal processing circuit 609a, a video RAM 610a, an audio circuit 611a are provided for a printed wiring board 607. A power supply voltage outputted from the power supply circuit 602, or various signals from the control circuit 601a, the image signal processing circuit 609a, the video RAM 610a, and the audio circuit 611a are supplied into the scanning line driver circuit 604a and the signal line driver circuit 605a through an FPC 606, and further are supplied to the pixel portion 603.

The power supply voltage of the printed wiring board 607 and various signals are supplied through an interface (I/F) portion 608 in which plural input terminals are arranged. A signal is inputted into the image signal processing circuit 609a from the interface (I/F) portion 608. A signal is sent and received between the image signal processing circuit 609a and the video RAM 610a.

Note that the printed wiring board 607 is mounted by using the FPC 606 in this embodiment mode; however, the present invention is not necessarily limited to this structure. The control circuit 601a and the power supply circuit 602 may be mounted directly on the substrate by a COG (Chip On Glass) method. In addition, a mounting method of an IC chip such as the signal line driver circuit and the scanning line driver circuit is not limited to this embodiment mode, and an IC chip formed on the substrate may be connected to a wiring in the pixel portion by a wire bonding method.

Further, in the printed wiring board 607, noise may be caused in the power supply voltage or signals, or the rise of the signal may become slow due to capacitance formed between leading wirings, resistance of the wiring itself, and the like. Thus, various kinds of elements such as a capacitor and a buffer may be provided on the printed wiring board 607, thereby preventing noise from being caused in the power supply voltage or signals, or preventing the rise of the signal from being slow.

As described above, a display device provided with a thin film transistor having a miniaturized wiring or the like can be manufactured.

Figure 19A:
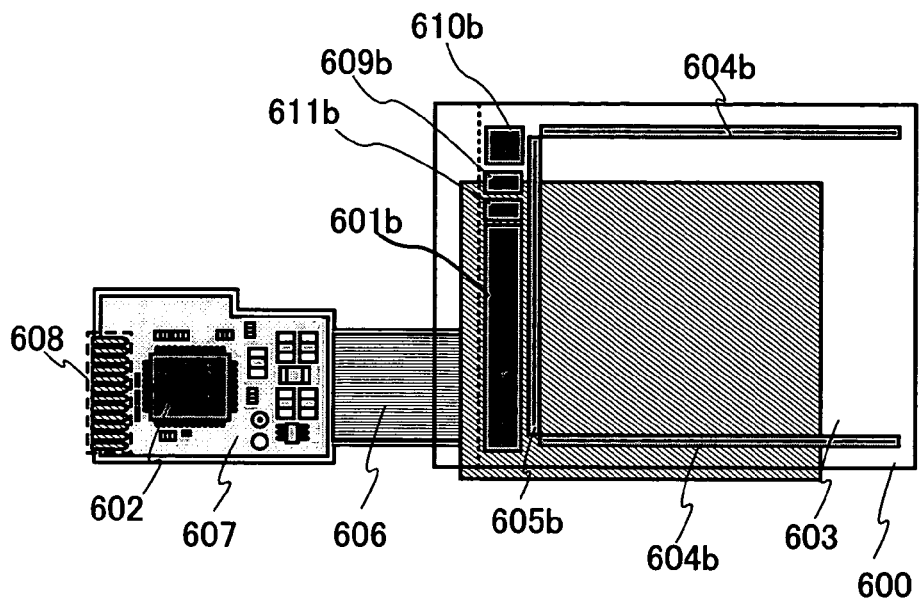
FIGS. 19A and 19B are each a top view of a display device according to one aspect of the invention.
Figure 19B:
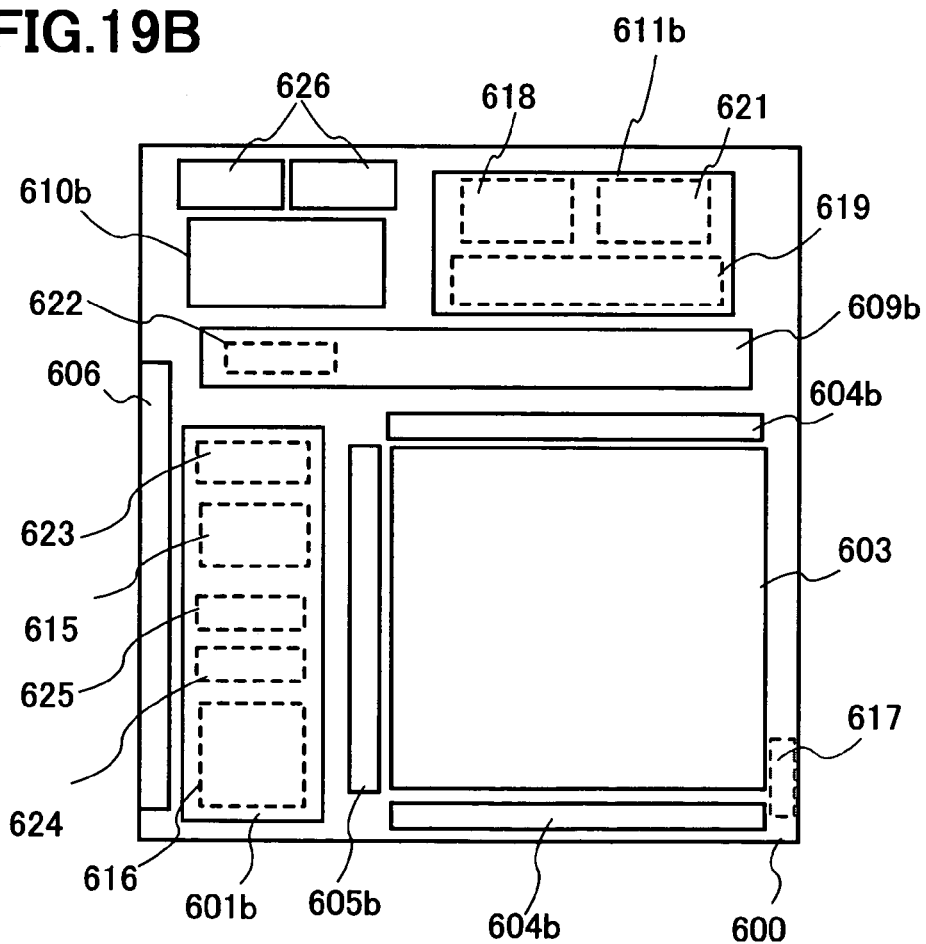

A mode of a display device different from that in FIG. 11 is shown in FIGS. 19A and 19B. In FIGS. 19A and 19B, a module is formed from a thin film transistor having a crystalline semiconductor film as shown in Embodiment Mode 5. Thus, an element formed in a driver circuit portion or a peripheral circuitry portion can be integrally formed on a substrate.

As shown in FIG. 19A, a pixel portion 603, a scanning line driver circuit 604b, a signal line driver circuit 605b, a control circuit 601b, an audio circuit 611b, an image signal processing circuit 609b, and a video RAM 610b are provided on a substrate 600. Accordingly, the number of elements formed on a printed wiring board can be reduced.

A block diagram of each circuit formed on the substrate 600 is shown in FIG. 19B. A circuit in which a liquid crystal element is formed in the pixel portion 603 is described. The pixel portion 603 is provided on a panel and a gray-scale power supply 617 for displaying with gray-scale is also formed on the panel. In the periphery of the pixel portion 603, a scanning line driver circuit 604a and a signal line driver circuit 605a are provided.

The control circuit 601b includes a CPU 616, a CPU interface (I/F) 623, a WRAM 624 serving as a stack/variable SRAM used by the CPU, a PROM 615 serving as a mask ROM storing a program and image data, and a memory controller 625. The memory controller 625 has a function for making a signal for controlling the audio circuit by decoding an interface of address/data pass of PROM and WRAM, and a part of an address signal for WRAM.

The audio circuit 611b includes an audio ROM 619 functioning as a mask ROM in which audio data is stored, an audio controller 621 having a function of forming a clock signal for the audio circuit or forming an address for the audio ROM using a counter, and an amplifier 618 having a function of forming analog waveform from digital audio data or amplifying the analog waveform.

The image signal processing circuit 609b includes a CRAM 622 serving as a SRAM storing color information of image data.

An SRAM 626 storing coordinate information of an image or image information for an image of one line is also provided.

Power from the power supply circuit 602 formed on the printed wiring board 607 is supplied to the respective circuits having these functions through the FPC 606.

When a thin film transistor is manufactured by using a crystalline semiconductor film like this, it can be integrally formed on a glass substrate, and thus, downsizing and reducing in weight of a display device can be achieved. Productivity of a display device can be increased, since the number of connecting points with FPC can be reduced.

As described above, a display device provided with a thin film transistor having a miniaturized wiring or the like can be manufactured.

[Embodiment Mode 13]

A mode of sealing a light emitting device shown in the foregoing embodiment modes is shown in Embodiment Mode 13.

Figure 12A:
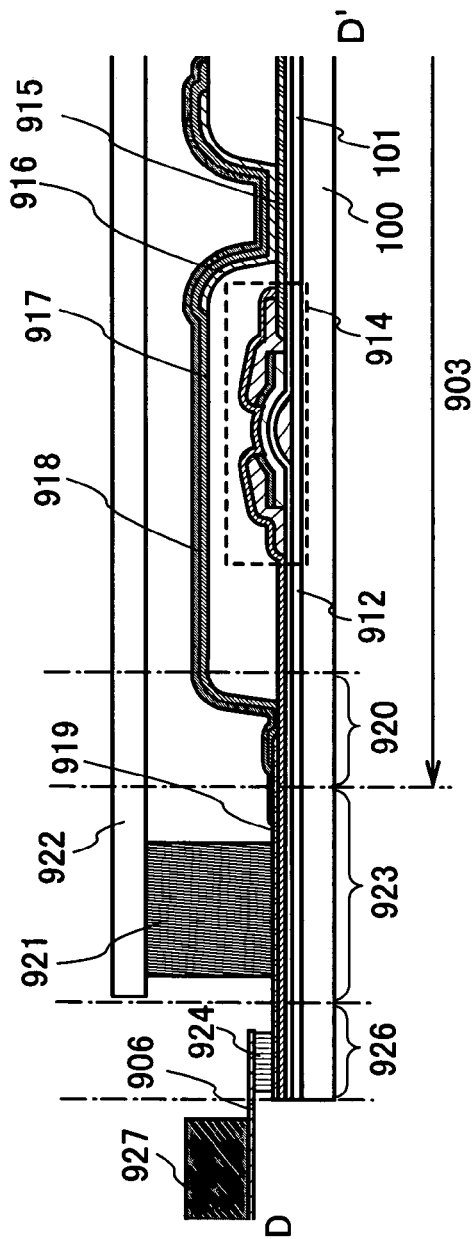
FIGS. 12A and 12B are each a cross-sectional view of a display device according to one aspect of the invention.

FIG. 12A is a cross-sectional view of a sealed light-emitting device, and a cross-sectional view taken along D–D' of FIG. 11. In a pixel portion 903, a driving TFT 914 having an N-channel is provided over a substrate 911 (referred to as a first substrate for convenience) with a base film 912 therebetween. The driving TFT can be formed to have a wiring or the like miniaturized in the foregoing embodiment modes. An anode 915 is connected to a wiring to serve as a source electrode or a drain electrode of the driving TFT. An electroluminescent layer 916 and a cathode 917 are formed in order over the anode.

A protective film 918 is further provided to cover the cathode. The protective film is formed to have an insulating film that mainly contains silicon nitride or silicon oxynitride and that is obtained by a sputtering method (DC method or RF method), a DLC film containing hydrogen, or a carbon nitride film. The protective film can have a single layer structure or a laminated structure of the above films. For example, when a film having high hardness is used to prevent entrance of water or oxygen as the protective film, it is possible that a film for relaxing stress, e.g., a carbon nitride film is formed and then, a film having high hardness is formed thereover. Deterioration of an electroluminescent layer by water, oxygen or the like can be prevented by the protective film.

The cathode and the protective film are provided to exist also in the first connection region 920. In the connection region 920, the cathode is connected to a connection wiring 919.

In a sealing region 923, the first substrate 911 is attached to an opposite substrate 922 (referred to as a second substrate for convenience) by a sealing material 921. The opposite substrate may be provided with a desiccant agent. By the desiccant agent, entrance of water or oxygen can be prevented. A color filter may be provided for the opposite substrate. A broad peak can be corrected to be sharp in light emitting spectrum of each RGB by the color filter. The sealing material is made of thermosetting resin or ultraviolet curable resin. The first substrate and the second substrate are adhered and fixed by heating the sealing material while pressuring or by ultraviolet irradiation. For example, epoxy system resin can be employed as the sealing material. The sealing material is mixed with a spacer. The space (that is, gap) between the first substrate and the second substrate is maintained by the spacer of the sealing material. The spacer may be spherical or column-like, and a cylindrical spacer is used in this embodiment mode, and thus, the gap is equivalent to a diameter of the circle.

In a second connection region 926, a connection wiring 919 is connected to a signal line driver circuit formed from an IC chip 927 by an anisotropic conductive film 924. The IC chip is provided on the FPC906. When the anisotropic conductive film is adhered by heating or pressuring, it is conducted carefully so that a crack is not generated due to a flexibility of a film substrate or softening by heating. For example, a substrate having high hardness may be arranged as an auxiliary in the adhering region. A clock signal, or a video signal is received from the thusly connected IC chip.

When the light emitting device is sealed with the second substrate 922, a space is formed between the second substrate 922 and the protective film 918. It is possible to further prevent entrance of water or oxygen by filling an inert gas, e.g. a nitrogen gas or forming a highly water-absorbing material in the space. Light-transmitting and highly water-absorbing resin may be formed. The light emitting device can be formed by using light-transmitting resin without reducing light-transmittance, even when light from a light emitting element is emitted toward the second substrate side.

Figure 12B:
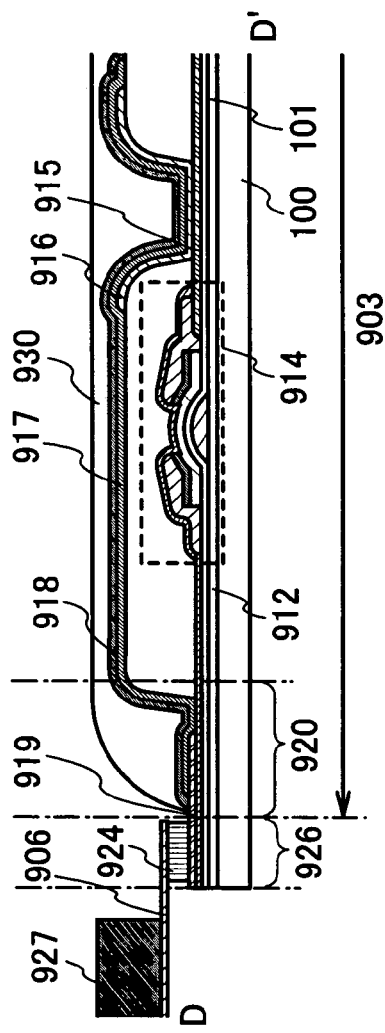

FIG. 12B shows a mode of sealing without using a second substrate, which is different from that of FIG. 12A. Other structures are similar, and thus description thereof is omitted.

In FIG. 12B, a second protective film 930 is provided to cover a protective film 918. An organic material such as epoxy resin, urethane resin or silicone resin can be used as the second protective film. The second protective film may be formed by dropping a polymeric (high-molecular-weight) material by an ink-jetting method. Epoxy resin is discharged by a dispenser and dried in this embodiment mode.

When deterioration of an electroluminescent layer due to water, oxygen or the like does not matter, the protective film 918 may not be necessarily provided. A second substrate may be provided over the second protective film for sealing.

When the light emitting device is sealed without using the second substrate, it is possible to reduce more in weight, size and thickness of a display device.

A polarizing plate or a circular polarizing plate may be provided to increase contrast in this embodiment mode. For example, a polarizing plate or a circular polarizing plate can be provided for one surface or both surfaces of a display screen.

[Embodiment Mode 14]

Examples of electronic devices using a display device described in the above embodiment modes can be given as follows: a video camera; a digital camera; a goggle type display (head mounted display); a navigation system; an audio reproducing device (such as a car audio or an audio component); a laptop personal computer; a game machine; a personal digital assistance (such as a mobile computer, a cellular phone, a portable game machine or an electronic book); an image reproducing device including a recording medium (specifically, a device capable of reproducing a recording medium such as a Digital Versatile Disc (DVD) and having a display that can display the image); and the like. Specifically, an ink-jetting method described in the above embodiment modes is preferably applied to a large-size television having a large screen, and the like. Practical examples of these electronic devices are shown in FIGS. 13A to 13C.

Figure 13A:
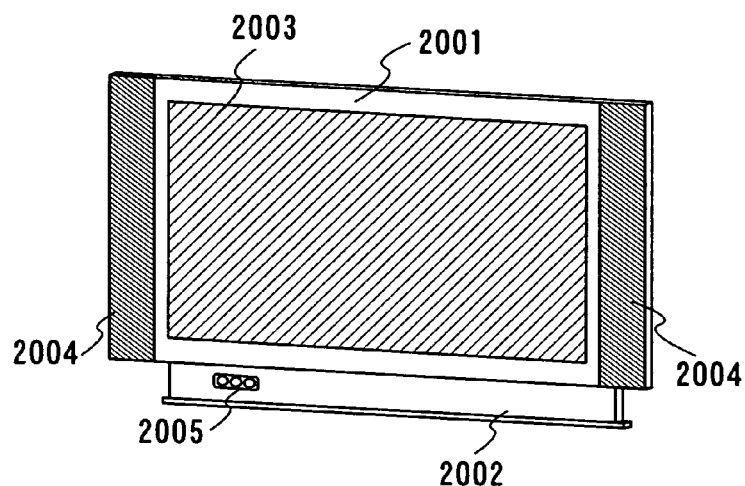
FIGS. 13A to 13C shows electronic devices according to one aspect of the invention.

FIG. 13A shows a large-size display device, which includes a chassis 2001, a supporting section 2002, a display portion 2003, a speaker portion 2004, a video input terminal 2005, and the like. The display portion 2003 is provided with a module including a pixel portion and a driver circuit portion. The pixel portion has a light emitting element or a liquid crystal element and a TFT formed by an ink-jetting method described in the above embodiment modes. Note that the display device includes all display devices for displaying information such as a display device for a personal computer, a display device for TV broadcasting reception, and a display device for advertisement.

Figure 13B:
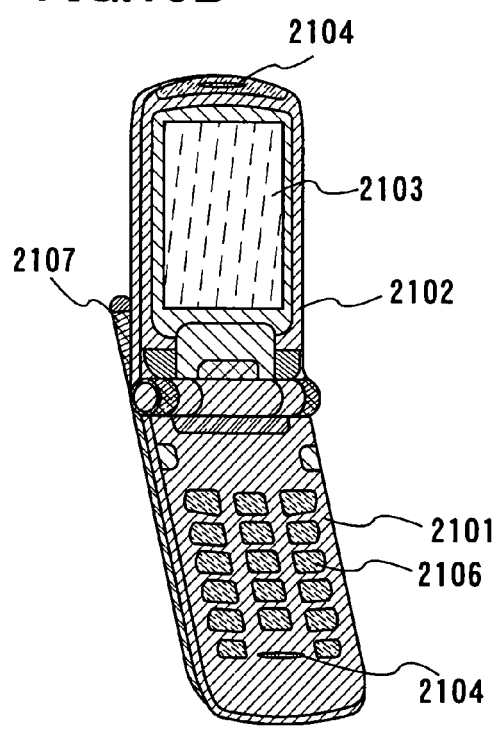

FIG. 13B shows a cellular phone that is one of mobile terminals, which includes a main body 2101, a chassis 2102, a display portion 2103, an audio input portion 2104, an audio output portion 2105, operation keys 2106, antenna 2107, and the like. The display portion 2103 is provided with a module including a pixel portion and a driver circuit portion. The pixel portion has a light emitting element or a liquid crystal element and a TFT formed by an ink-jetting method described in the above embodiment modes. In addition, costs of the cellular phone can be reduced by forming the display portion 2103 by a method of forming plural panels from one substrate (gang printing).

Figure 13C:
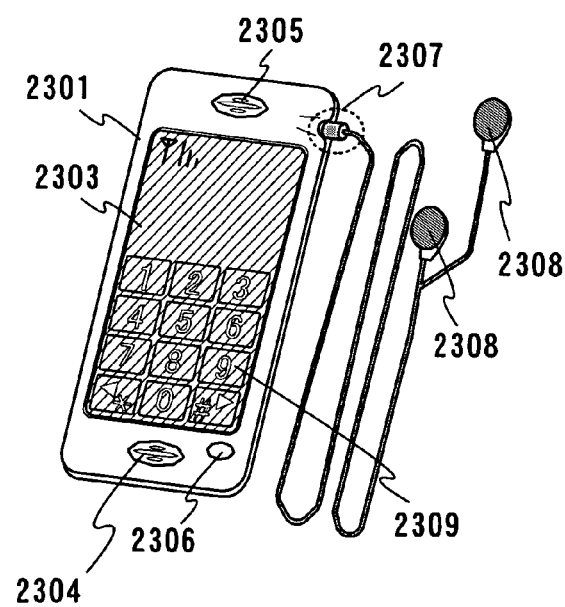

FIG. 13C shows a sheet-like cellular phone, which includes a main body 2301, a display portion 2303, an audio input portion 2304, an audio output portion 2305, a switch 2306, an external connection port 2307, and the like. A separately prepared earphone 2308 can be connected to the cellular phone through the external connection port 2307. A touch panel display screen with a sensor is used for the display portion 2303. A series of operation can be performed by touching the touch panel operation key 2309 displayed on the display portion 2303. The display portion 2303 is provided with a module having a pixel portion and a driver circuit portion. The pixel portion has a light emitting element or a liquid crystal element and a TFT formed by an ink-jetting method described in the above embodiment modes. In addition, costs of the sheet-like cellular phone can be reduced by forming the display portion 2303 by a method of forming plural panels from one substrate (gang printing).

As described above, an applicable range of the present invention is so wide that it can be applied to electronic devices of various fields. In addition, the electronic devices of this embodiment mode can employ any structure described in the above embodiment modes.

[Embodiment Mode 15]

An inert gas can be employed as a treatment gas of a plasma treatment in the present invention. A rare gas such as helium (He), neon (Ne), argon (Ar), krypton (Kr), xenon (Xe) can be used as the inert gas. Other conditions such as pressure are similar to those described in the foregoing embodiment modes.

EXAMPLE

Example 1 shows examined results of bond states of surfaces of an amorphous silicon film, a glass, and acrylic which are exposed to a plasma treatment for 30 seconds by XPS (X-ray photoelectron spectroscopy).

Figure 16A:
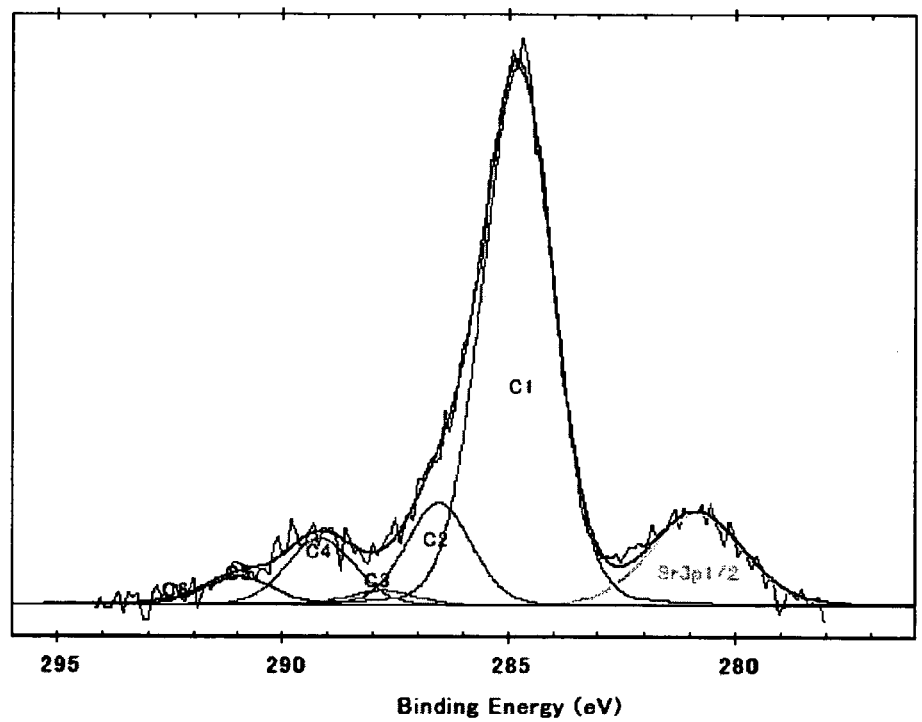
FIGS. 16A and 16B are each a graph showing a result of XPS to a glass sample.
Figure 16B:
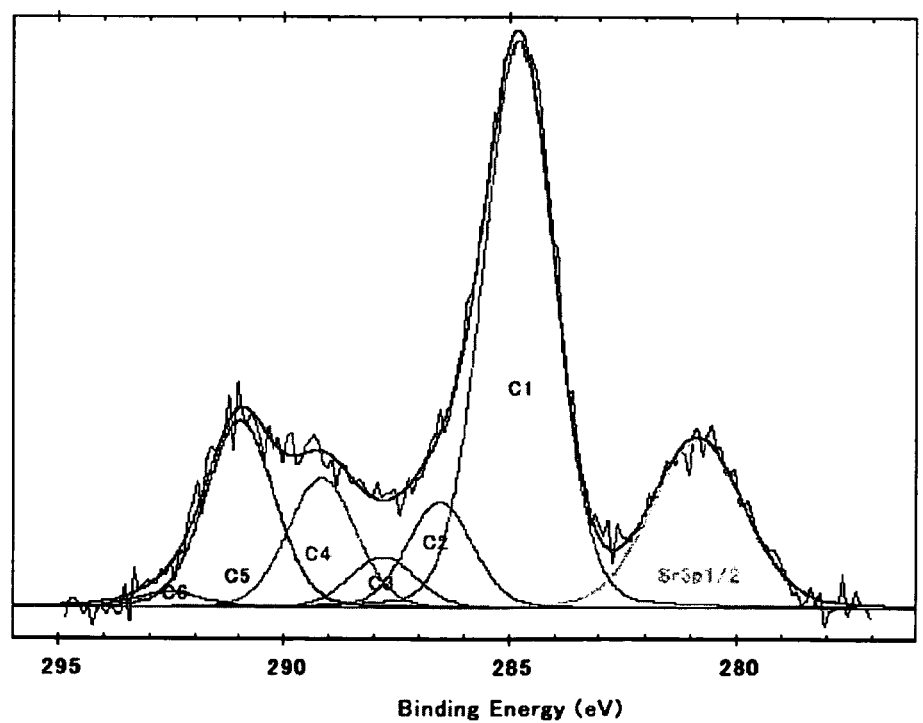

FIG. 16A shows a result before performing a plasma treatment on a glass, whereas FIG. 16B shows a result after performing the plasma treatment on the glass. An energy band of $CF_2$ bond was shown by C5 having a peak in the vicinity of 290 eV and an area ratio of $CF_2$ bond peak was 3.18% in FIG. 16A. On the other hand, an area ratio of $CF_2$ bond peak was 14.6% in FIG. 16B. The area ratio of $CF_2$ bond peak was increased by the plasma treatment for 30 seconds. The intensity of $CF_2$ bond was 4.89% and 32.86% in FIGS. 16A and 16B, respectively.

Figure 17A:
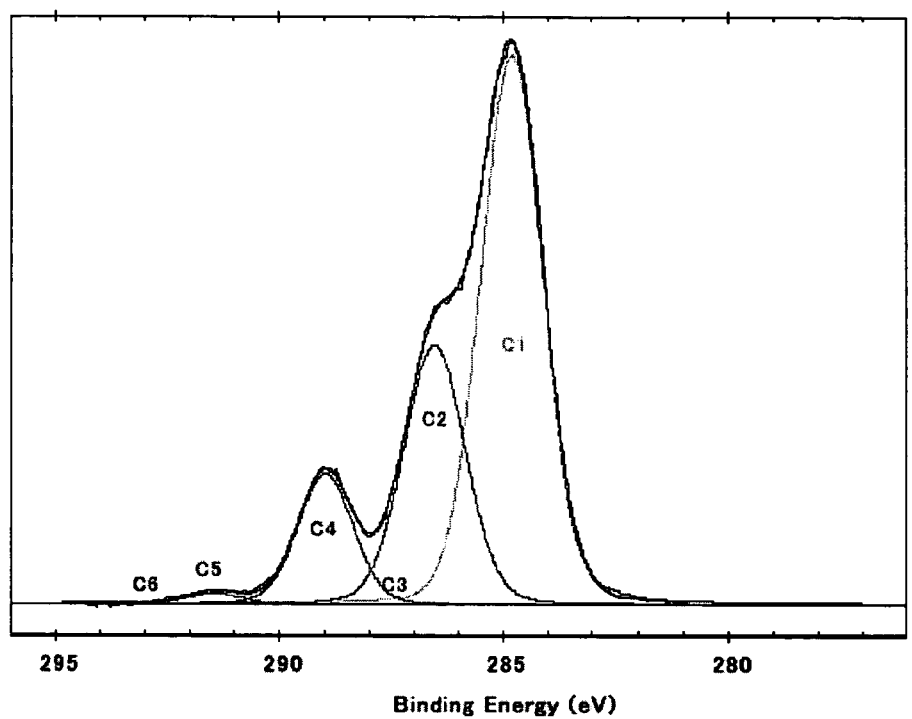
FIGS. 17A and 17B are each a graph showing a result of XPS to an acrylic sample.
Figure 17B:
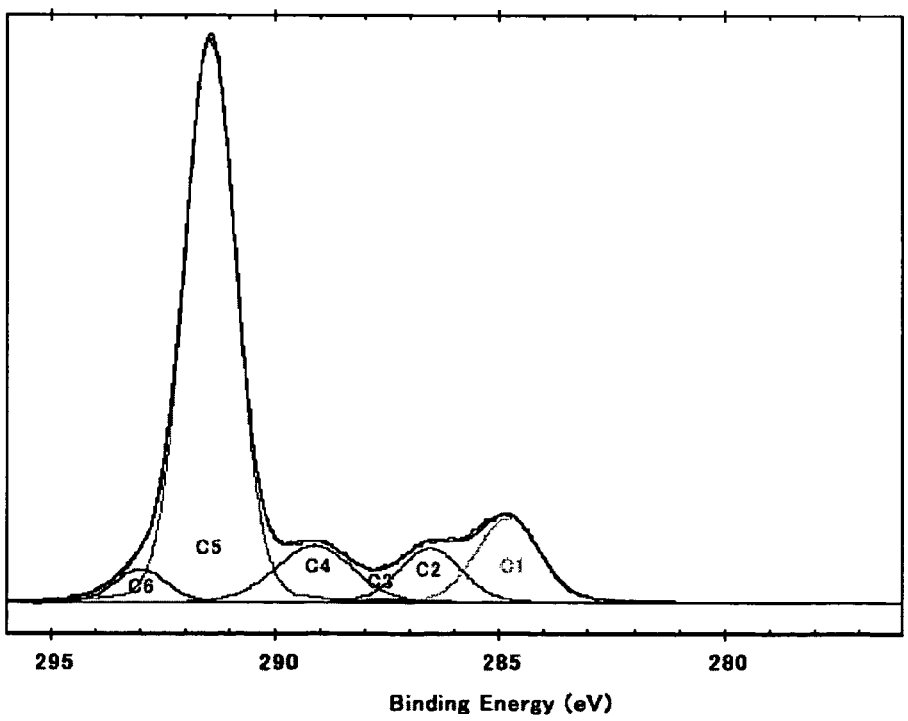

FIG. 17A shows a result before performing a plasma treatment on acrylic, whereas FIG. 17B shows a result after performing the plasma treatment on acrylic. An area ratio of $CF_2$ bond peak was 0.92% in FIG. 17A. On the other hand, an area ratio of $CF_2$ bond peak was 65.83% in FIG. 17B. The intensity of $CF_2$ bond was increased drastically by only the plasma treatment for 30 seconds. The intensity of $CF_2$ bond was 1.88% and 100% in FIGS. 17A and 17B, respectively.

As mentioned above, a peak due to $CF_2$ bond tends to increase by performing a plasma treatment. Therefore, it is considered that $CF_2$ bonds are increased by the plasma treatment, thereby showing/exerting/having/providing a liquid-repellent property. It is thought that fluorine (F) is caused by Teflon (a registered trademark) covering an electrode of a plasma processor. Therefore, it is concluded that $CF_2$ bond is formed on a surface for a conductive film to the like which is required to be miniaturized.

This application is based on Japanese Patent Application serial no. 2003-368030 filed in Japan Patent Office on Oct. 28$^{th}$, 2003, the contents of which are hereby incorporated by reference.

What is claimed is:

1. A method for manufacturing a thin film transistor comprising: performing a plasma treatment on a surface for forming a gate electrode to form a first liquid-repellent region;

dropping a composition including a material of the gate electrode to form the gate electrode on the first liquid-repellent region of the surface for forming the gate electrode;

performing a plasma treatment on a surface for forming source and drain electrodes to be a second liquid-repellent; and dropping a composition including a material of the source and drain electrodes to form the source and drain electrodes on the second liquid-repellent region of the surface for forming the source and drain electrodes.

2. A method for manufacturing a thin film transistor comprising:
- performing a plasma treatment on a substrate to form a first liquid-repellent region;
- dropping a composition including a material of the gate electrode to form a gate electrode on the first liquid-repellent region of the substrate;
- forming a gate insulating film to cover the gate electrode;
- forming a semiconductor film over the gate electrode;
- forming a semiconductor film having one conductivity over the semiconductor film;
- performing a plasma treatment on the semiconductor film having one conductivity and the gate insulating film to form a second liquid-repellent region;
- dropping a composition including a material of source and drain electrodes to form the source and drain electrodes on the second liquid-repellent region of the semiconductor film having one conductivity and the gate insulating film.

3. A method for manufacturing a thin film transistor comprising:
- forming source and drain electrodes;
- forming a semiconductor film over the source and drain electrodes;
- performing a plasma treatment on a surface for forming a gate electrode over the semiconductor film to form a liquid-repellent region; and
- dropping a composition including a material of the gate electrode to form the gate electrode on the liquid-repellent region of the surface for forming the gate electrode.

4. A method for manufacturing a thin film transistor comprising:
- forming source and drain electrodes over a base film;
- forming a semiconductor film over the source and drain electrodes;
- performing a plasma treatment on a surface of the semiconductor film to form a first liquid-repellent region;
- dropping a composition including a material of a mask to forming the mask on the first liquid-repellent region of the semiconductor film;
- patterning the semiconductor film by using the mask;
- forming a gate insulating film to cover the semiconductor film;
- performing a plasma treatment on the gate insulating film to form a second liquid-repellent region;
- dropping a composition including a material of a gate electrode to form the gate electrode on the second liquid repellent region of the gate insulating film.

5. A method for manufacturing a thin film transistor comprising:
- performing a plasma treatment on a base film to form a first liquid-repellent region;
- dropping a composition including a material of source and drain electrodes to form the source and drain electrodes on the first liquid-repellent region of the base film;
- forming a semiconductor film over the source and drain electrodes;
- performing a plasma treatment on the semiconductor film to form a second liquid-repellent region;
- dropping a composition including a material of a mask to forming the mask on the second liquid-repellent region of the semiconductor film;
- patterning the semiconductor film by using the mask;
- forming a gate insulating film to cover the semiconductor film;
- performing a plasma treatment on the gate insulating film to form a third liquid-repellent region; and
- dropping a composition including a material of a gate electrode to form the gate electrode on the third liquid-repellent region of the gate insulating film.

6. A method for manufacturing a thin film transistor comprising:
- forming a Teflon film;
- dropping a composition including a material of a gate electrode to form the gate electrode over the Teflon film;
- performing a heat treatment so as to bake the gate electrode; and
- removing the Teflon film by the heat treatment.

7. A method for manufacturing a thin film transistor comprising:
- forming a first Teflon film;
- dropping a composition including a material of a gate electrode to form the gate electrode over the first Teflon film;
- performing a heat treatment so as to bake the gate electrode;
- removing the first Teflon film by the heat treatment;
- forming a gate insulating film to cover the gate electrode;
- forming a semiconductor film over the gate electrode;
- forming a semiconductor film having one conductivity over the semiconductor film;
- forming a second Teflon film over the semiconductor film having one conductivity and the gate insulating film;
- dropping a composition including a material of source and drain electrodes to form the source and drain electrodes over the semiconductor film having one conductivity and the gate insulating film;
- performing a heat treatment so as to bake the source and drain electrodes; and
- removing the second Teflon film by the heat treatment.

8. The method for manufacturing a thin film transistor according to any one of claims 1, 2, 3, 4, 5, 6, and 7, comprising:
- forming an interlayer insulating film over the thin film transistor;
- forming an opening in the interlayer insulating film;
- performing a plasma treatment on the interlayer insulating film in winch the opening is formed so that the opening and a surface of the interlayer insulating film become liquid-repellent; and
- dropping a composition including a material of a wiring to form the wiring to be connected to the source or drain electrodes of the thin film transistor though the opening.

9. The method for manufacturing a thin film transistor according to any one of claims 1, 2, 3, 4, 5, 6, and 7, comprising:
- forming an interlayer insulating film over the thin film transistor;
- performing a plasma treatment on the interlayer insulating film so that a surface of the interlayer insulating film become liquid-repellent;
- forming an opening in the interlayer insulating film; and
- dropping a composition including a material of a wiring to form the wiring to be connected to the source electrode or drain electrode of the thin film transistor through the opening;
- wherein the opening is less liquid-repellent than the surface of the interlayer insulating film.

10. The method for forming a wiring according to any one of claims 1, 2, 3, 4, 5, 6, and 7, wherein the composition is dropped by an ink-jetting method.

* * * * *